(12) United States Patent
Forbes et al.

(10) Patent No.: US 7,489,545 B2
(45) Date of Patent: Feb. 10, 2009

(54) MEMORY UTILIZING OXIDE-NITRIDE NANOLAMINATES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 11/492,749

(22) Filed: Jul. 25, 2006

(65) Prior Publication Data

US 2006/0258097 A1 Nov. 16, 2006

Related U.S. Application Data

(62) Division of application No. 10/933,050, filed on Sep. 2, 2004, which is a division of application No. 10/190,689, filed on Jul. 8, 2002.

(51) Int. Cl.
G11C 16/04 (2006.01)
(52) U.S. Cl. .............................. 365/185.05; 365/185.03
(58) Field of Classification Search ............ 365/185.05, 365/185.03, 185.02, 210, 51, 63; 257/327, 257/325, 760
See application file for complete search history.

(56) References Cited

U.S. PATENT DOCUMENTS

| | | | |
|---|---|---|---|
| 3,665,423 A | 5/1972 | Nakamuma et al. | |
| 3,877,054 A | 4/1975 | Boulin et al. | |
| 3,964,085 A | 6/1976 | Kahng et al. | |
| 4,217,601 A | 8/1980 | DeKeersmaecker et al. | |
| 4,507,673 A | 3/1985 | Aoyama et al. | |
| 4,661,833 A | 4/1987 | Mizutani | |
| 4,939,559 A | 7/1990 | DiMaria et al. | |
| 5,016,215 A | 5/1991 | Tigelaar | |
| 5,017,977 A | 5/1991 | Richardson | |
| 5,021,999 A | 6/1991 | Kohda et al. | |
| 5,027,171 A | 6/1991 | Reedy et al. | |
| 5,111,430 A | 5/1992 | Morie | |
| 5,253,196 A | 10/1993 | Shimabukuro | |
| 5,274,249 A | 12/1993 | Xi et al. | |

(Continued)

FOREIGN PATENT DOCUMENTS

JP 03-222367 10/1991

(Continued)

OTHER PUBLICATIONS

Abbas, S.A., et al., "N-Channel Igfet Design Limitations Due to Hot Electron Trapping", *Technical Digest, International Electron Devices Meeting*, Washington, DC,(Dec. 1975),35-38.

(Continued)

*Primary Examiner*—Vu A Le
(74) *Attorney, Agent, or Firm*—Schwegman, Lundberg & Woessner, P.A.

(57) ABSTRACT

Structures, systems and methods for transistors utilizing oxide-nitride nanolaminates are provided. One transistor embodiment includes a first source/drain region, a second source/drain region, and a channel region therebetween. A gate is separated from the channel region by a gate insulator. The gate insulator includes oxide-nitride nanolaminate layers to trap charge in potential wells formed by different electron affinities of the oxide-nitride nanolaminate layers.

24 Claims, 12 Drawing Sheets

U.S. PATENT DOCUMENTS

| | | |
|---|---|---|
| 5,293,560 A | 3/1994 | Harari |
| 5,298,447 A | 3/1994 | Hong |
| 5,303,182 A | 4/1994 | Nakao et al. |
| 5,317,535 A | 5/1994 | Talreja et al. |
| 5,388,069 A | 2/1995 | Kokubo |
| 5,409,859 A | 4/1995 | Glass et al. |
| 5,424,993 A | 6/1995 | Lee et al. |
| 5,430,670 A | 7/1995 | Rosenthal |
| 5,434,815 A | 7/1995 | Smarandoiu et al. |
| 5,438,544 A | 8/1995 | Makino |
| 5,449,941 A | 9/1995 | Yamazaki et al. |
| 5,467,306 A | 11/1995 | Kaya et al. |
| 5,477,485 A | 12/1995 | Bergemont et al. |
| 5,485,422 A | 1/1996 | Bauer et al. |
| 5,493,140 A | 2/1996 | Iguchi |
| 5,508,543 A | 4/1996 | Hartstein et al. |
| 5,508,544 A | 4/1996 | Shah |
| 5,530,581 A | 6/1996 | Cogan |
| 5,602,777 A | 2/1997 | Nawaki et al. |
| 5,627,781 A | 5/1997 | Hayashi et al. |
| 5,670,790 A | 9/1997 | Katoh et al. |
| 5,677,867 A | 10/1997 | Hazani |
| 5,698,022 A | 12/1997 | Glassman et al. |
| 5,714,766 A | 2/1998 | Chen et al. |
| 5,754,477 A | 5/1998 | Forbes |
| 5,768,192 A | 6/1998 | Eitan |
| 5,795,808 A | 8/1998 | Park |
| 5,801,401 A | 9/1998 | Forbes |
| 5,828,605 A | 10/1998 | Peng et al. |
| 5,852,306 A | 12/1998 | Forbes |
| 5,886,368 A | 3/1999 | Forbes et al. |
| 5,912,488 A | 6/1999 | Kim et al. |
| 5,916,365 A | 6/1999 | Sherman |
| 5,936,274 A | 8/1999 | Forbes et al. |
| 5,943,262 A | 8/1999 | Choi |
| 5,959,896 A | 9/1999 | Forbes |
| 5,973,356 A | 10/1999 | Noble |
| 5,989,958 A | 11/1999 | Forbes |
| 5,991,225 A | 11/1999 | Forbes et al. |
| 6,005,790 A | 12/1999 | Chan et al. |
| 6,011,725 A | 1/2000 | Eitan |
| 6,013,553 A | 1/2000 | Wallace et al. |
| 6,020,024 A | 2/2000 | Maiti et al. |
| 6,027,961 A | 2/2000 | Maiti et al. |
| 6,031,263 A | 2/2000 | Forbes et al. |
| 6,049,479 A | 4/2000 | Thurgate et al. |
| 6,072,209 A | 6/2000 | Noble |
| 6,110,529 A | 8/2000 | Gardiner et al. |
| 6,115,281 A | 9/2000 | Aggarwal et al. |
| 6,122,201 A | 9/2000 | Lee et al. |
| 6,124,729 A | 9/2000 | Noble |
| 6,140,181 A | 10/2000 | Forbes et al. |
| 6,143,636 A | 11/2000 | Forbes et al. |
| 6,153,468 A | 11/2000 | Forbes |
| 6,160,739 A | 12/2000 | Wong |
| 6,166,401 A | 12/2000 | Forbes |
| 6,171,900 B1 | 1/2001 | Sun |
| 6,194,228 B1 | 2/2001 | Fujiki et al. |
| 6,203,613 B1 | 3/2001 | Gates et al. |
| 6,222,768 B1 | 4/2001 | Hollmer et al. |
| 6,225,168 B1 | 5/2001 | Gardner et al. |
| 6,232,643 B1 | 5/2001 | Forbes et al. |
| 6,238,976 B1 | 5/2001 | Noble et al. |
| 6,243,300 B1 | 6/2001 | Sunkavalli |
| 6,246,606 B1 | 6/2001 | Forbes et al. |
| 6,249,020 B1 | 6/2001 | Forbes et al. |
| 6,255,683 B1 * | 7/2001 | Radens et al. ............. 257/301 |
| 6,269,023 B1 | 7/2001 | Derhacobian et al. |
| 6,294,813 B1 | 9/2001 | Forbes et al. |
| 6,297,539 B1 | 10/2001 | Ma et al. |
| 6,303,481 B2 | 10/2001 | Park |
| 6,313,518 B1 | 11/2001 | Ahn et al. |
| 6,320,784 B1 | 11/2001 | Muralidhar et al. |
| 6,320,786 B1 | 11/2001 | Chang et al. |
| 6,351,411 B2 | 2/2002 | Forbes et al. |
| 6,353,554 B1 | 3/2002 | Banks |
| 6,365,470 B1 | 4/2002 | Maeda |
| 6,380,579 B1 | 4/2002 | Nam et al. |
| 6,407,435 B1 | 6/2002 | Ma et al. |
| 6,429,063 B1 | 8/2002 | Eitan |
| 6,432,779 B1 | 8/2002 | Hobbs et al. |
| 6,438,031 B1 | 8/2002 | Fastow |
| 6,445,030 B1 | 9/2002 | Wu et al. |
| 6,449,188 B1 | 9/2002 | Fastow |
| 6,456,531 B1 | 9/2002 | Wang et al. |
| 6,456,536 B1 | 9/2002 | Sobek et al. |
| 6,459,618 B1 | 10/2002 | Wang |
| 6,465,306 B1 | 10/2002 | Ramsbey et al. |
| 6,487,121 B1 | 11/2002 | Thurgate et al. |
| 6,490,204 B2 | 12/2002 | Bloom et al. |
| 6,490,205 B1 | 12/2002 | Wang et al. |
| 6,504,755 B1 | 1/2003 | Katayama et al. |
| 6,521,950 B1 | 2/2003 | Shimabukuro et al. |
| 6,521,958 B1 | 2/2003 | Forbes et al. |
| 6,525,969 B1 | 2/2003 | Kurihara et al. |
| 6,541,816 B2 | 4/2003 | Ramsbey et al. |
| 6,545,314 B2 | 4/2003 | Forbes et al. |
| 6,552,387 B1 | 4/2003 | Eitan |
| 6,559,014 B1 | 5/2003 | Jeon |
| 6,566,699 B2 | 5/2003 | Eitan |
| 6,567,303 B1 | 5/2003 | Hamilton et al. |
| 6,567,312 B1 | 5/2003 | Torii et al. |
| 6,570,787 B1 | 5/2003 | Wang et al. |
| 6,580,118 B2 | 6/2003 | Ludwig et al. |
| 6,580,124 B1 | 6/2003 | Cleeves et al. |
| 6,618,290 B1 | 9/2003 | Wang et al. |
| 6,630,381 B1 | 10/2003 | Hazani |
| 6,642,573 B1 | 11/2003 | Halliyal et al. |
| 6,674,138 B1 | 1/2004 | Halliyal et al. |
| 6,714,455 B2 | 3/2004 | Banks |
| 6,867,097 B1 | 3/2005 | Ramsbey et al. |
| 6,873,539 B1 | 3/2005 | Fazan et al. |
| 7,045,430 B2 | 5/2006 | Ahn et al. |
| 7,193,893 B2 | 3/2007 | Forbes |
| 7,221,017 B2 | 5/2007 | Forbes et al. |
| 7,221,586 B2 | 5/2007 | Forbes et al. |
| 7,348,237 B2 | 3/2008 | Forbes |
| 7,369,435 B2 | 5/2008 | Forbes |
| 2002/0003252 A1 | 1/2002 | Iyer |
| 2002/0027264 A1 | 3/2002 | Forbes et al. |
| 2002/0036939 A1 | 3/2002 | Tsai et al. |
| 2002/0074565 A1 | 6/2002 | Flagan et al. |
| 2002/0089023 A1 | 7/2002 | Yu et al. |
| 2002/0115252 A1 | 8/2002 | Haukka et al. |
| 2002/0192974 A1 | 12/2002 | Ahn et al. |
| 2003/0032270 A1 | 2/2003 | Snyder et al. |
| 2003/0235077 A1 | 12/2003 | Forbes |
| 2003/0235081 A1 | 12/2003 | Forbes |
| 2003/0235085 A1 | 12/2003 | Forbes |
| 2004/0063276 A1 | 4/2004 | Yamamoto et al. |
| 2006/0001080 A1 | 1/2006 | Forbes |
| 2006/0002188 A1 | 1/2006 | Forbes |
| 2006/0284246 A1 | 12/2006 | Forbes et al. |
| 2007/0178643 A1 | 8/2007 | Forbes et al. |

FOREIGN PATENT DOCUMENTS

| | | |
|---|---|---|
| JP | 06-224431 | 8/1994 |
| JP | 06-302828 | 10/1994 |

| JP | 08-255878 | 10/1996 |

OTHER PUBLICATIONS

Adelmann, C, et al., "Atomic-layer epitaxy of GaN quantum wells and quantum dots on (0001) AlN", *Journal of Applied Physics*, 91(8). (Apr. 15, 2002),5498-5500.

Ahn, Seong-Deok, et al., "Surface Morphology Improvement of Metalorganic Chemical Vapor Deposition Al Films by Layered Deposition of Al and Ultrathin TiN", *Japanese Journal of Applied Physics, Part 1* (Regular Papers, Short Notes & Review Papers),39(6A), (Jun. 2000),3349-3354.

Akasaki, Isamu, et al., "Effects of AlN Buffer Layer on Crystallographic Structure and on Electrical and Optical Properties of GaN and Ga1-xAlxN Films Grown on Sapphire Substrate by MOVPE", *Journal of Crystal Growth*, 98(1-2). (Nov. 1, 1989),209-219.

Alen, Petra, "Atomic Layer deposition of Ta(Al)N(C) thin films using trimethylaluminum as a reducing agent", *Journal of the Electrochemical Society*, 148(10). (Oct. 2001),G566-G571.

Asari, K, et al., "Multi-mode and multi-level technologies for FeRAM embedded reconfigurable hardware", *Solid-State Circuits Conference, 1999. Digest of Technical Papers. ISSCC. 1999 IEEE International*,(Feb. 15-17, 1999),106-107.

Benjamin, M., "UV Photoemission Study of Heteroepitaxial AlGaN Films Grown on 6H-SiC", *Applied Surface Science*, 104/105, (Sep. 1996),455-460.

Bermudez, V., "The Growth and Properties of Al and AlN Films on GaN(0001)-(1 ×1)", *Journal of Applied Physics*, 79(1). (Jan. 1996),110-119.

Bright, A A., et al., "Low-rate plasma oxidation of Si in a dilute oxygen/helium plasma for low-temperature gate quality Si/SiO2 interfaces", *Applied Physics Letters*, 58(6), (Feb. 1991),619-621.

Britton, J, et al., "Metal-nitride-oxide IC memory retains data for meter reader", *Electronics*, 45(22), (Oct. 23, 1972),119-23.

Carter, R J., "Electrical Characterization of High-k Materials Prepared By Atomic Layer CVD", *IWGI*, (2001),94-99.

Chaitsak, Suticai, et al., "Cu(InGa)Se$_2$ thin-film solar cells with high resistivity ZnO buffer layers deposited by atomic layer deposition", *Japanese Journal of Applied Physics Part 1—Regular Papers Short Notes & Review Papers*, 38(9A). (Sep. 1999),4989-4992.

Chang, C., "Novel Passivation Dielectrics—The Boron—or Phosphorus-Doped Hydrogenated Amorphous Silicon Carbide Films", *Journal of the Electrochemical Society*, 132, (Feb. 1985),418-422.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999),1537-1544.

Cricchi, J R., et al., "Hardened MNOS/SOS electrically reprogrammable nonvolatile memory", *IEEE Transactions on Nuclear Science*, 24(6), (Dec. 1977),2185-9.

Demichelis, F., "Influence of Doping on the Structural and Optoelectronic Properties of Amorphous and Microcrystalline Silicon Carbide", *Journal of Applied Physics*, 72(4). (Aug. 15, 1992),1327-1333.

Demichelis, F., "Physical Properties of Undoped and Doped Microcrystalline SIC:H Deposited By PECVD", *Materials Research Society Symposium Proceedings*, 219. Anaheim, CA,(Apr. 30-May 3, 1991),413-418.

Dimaria, D J., "Graded or stepped energy band-gap-insulator MIS structures (GI-MIS or SI-MIS)", *Journal of Applied Physics*, 50(9), (Sep. 1979),5826-5829.

Dipert, B., et al., "Flash Memory goes Mainstream", *IEE Spectrum, No. 10*, (Oct. 1993),48-50.

Eitan, Boaz, et al., "NROM: A Novel Localized Trapping, 2-Bit Nonvolatile Memory Cell", *IEEE Electron Device Letters*, 21(11), (Nov. 2000),543-545.

Elam, J W., et al., "Kinetics of the WF$_6$ and Si$_2$H$_6$ surface reactions during tungsten atomic layer deposition", *Surface Science*, 479(1-3), (May 2001), 121-135.

Fauchet, P M., et al., "Optoelectronics and photovoitaic applications of microcrystalline SiC", *Symp. on Materials Issues in Mecrocrystalline Semiconductors*, (1989),291-292.

Ferris-Prabhu, A V., "Amnesia in layered insulator FET memory devices", *1973 International Electron Devices Meeting Technical Digest*, (1973),75-77.

Ferris-Prabhu, A V., "Charge transfer in layered insulators", *Solid-State Electronics*, 16(9), (Sep. 1973),1086-7.

Ferris-Prabhu, A V., "Tunnelling theories of non-volatile semiconductor memories", *Physica Status Solidi A*, 35(1), (May 16, 1976),243-50.

Fisch, D E., et al., "Analysis of thin film ferroelectric aging", *Proc. IEEE Int. Reliability Physics Symp.*, (1990),237-242.

Forbes, L., et al., "Field Induced Re-Emission of Electrons Trapped in SiO", *IEEE Transactions on Electron Devices*, ED-26 (11), Briefs,(Nov. 1979),1816-1818.

Forsgren, Katarina, "Atomic Layer Deposition of HfO$_2$ using hafnium iodide", *Conference held in Monterey, California*, (May 2001),1 page.

Frohman-Bentchkowsky, D, "An Integrated metal-nitride-oxide-silicon (MNOS) memory", *Proceedings of the IEEE*, 57(6). (Jun. 1969),1190-1192.

Fuyuki, Takashi, et al., "Electronic Properties of the Interface between Si and TiO$_2$ Deposited at Very Low Temperatures", *Japanese Journal of Applied Physics, Part 1 (Regular Papers & Short Notes)*, 25(9). (Sept. 1986),1288-1291.

Fuyuki, Takashi, et al., "Initial stage of ultra-thin SiO2 formation at low temperatures using activated oxygen", *Applied Surface Science*, 117-118, (Jun. 1997),123-126.

Guha, S, et al., "Atomic beam deposition of lanthanum-and yttrium-based oxide thin films for gate dielectrics", *Applied Physics Letters*, 77, (2000),2710-2712.

Hubbard, K. J., et al., "Thermodynamic stability of binary oxides in contact with silicon", *Journal of Materials Research*, 11(11). (Nov. 1996),2757-2776.

Hwang, N., et al., "Tunneling and Thermal Emission of Electrons from a Distribution of Deep Traps in SiO", *IEEE Transactions on Electron Devices*, 40(6), (Jun. 1993),1100-1103.

Jeong, Chang-Wook, "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001),285-289.

Juppo, Marika, "Use of 1,1-Dimethylhydrazine in the Atomic Layer Deposition of Transition Metal Nitride Thin Films", *Journal of the Electrochemical Society*, 147(9), (Sep. 2000),3377-3381.

Kim, C. T., et al., "Application of Al$_2$O$_3$ Grown by Atomic Layer Deposition to DRAM and FeRAM", *International Symposium in Integrated Ferroelectrics*, (Mar. 2000),316.

Klaus, J W., et al., "Atomic layer deposition of tungsten nitride films using sequential surface reactions", *Journal of the Electrochemical Society*, 147(3), (Mar. 2000),1175-81.

Koo, J, "Study on the characteristics of TiAlN thin film deposited by atomic layer deposition method", *Journal of Vacuum Science & Technology A-Vacuum Surfaces & Films*, 19(6), (Nov. 2001),2831-4.

Kukli, Kaupo, "Atomic Layer Deposition of Titanium Oxide Til$_4$ and H$_2$O$_2$", *Chemical Vapor Deposition*, 6(6), (2000),303-310.

Kukli, Kaupo, "Tailoring the dielectric properties of HfO$_2$-Ta$_2$O$_3$nanolaminates", *Appl. Phys. Lett.*, 68, (1996),3737-3739.

Lee, Dong H., et al., "Metalorganic chemical vapor deposition of TiO$_2$ Nanatase thin film on Si substrate", *Applied Physics Letters*, 66(7), (Feb. 1995),815-816.

Lei, T., "Epitaxial Growth and Characterization of Zinc-Blende Gallium Nitride on (001) Silicon", *Journal of Applied Physics*, 71(10), (May 1992),4933-4943.

Leskela, M, "ALD precursor chemistry: Evolution and future challenges", *Journal de Physique IV* (Proceedings), 9(8), (Sept. 1999),837-852.

Liu, C. T., "Circuit Requirement and Integration Challenges of Thin Gate Dielectrics for Ultra Small MOSFETs", *International Electron Devices Meeting 1998. Technical Digest*, (1998),747-750.

Luan, H., "High Quality Ta$_2$O$_5$ Gate Dielectrics with Tox,eq less than 10A", *IEDM*, (1999),pp.141-144.

Lusky, et al., "Characterization of channel hot electron injection by the subthreshold slope of NROM/sup TM/device", *IEEE Electron Device Letters*, vol. 22, No. 11, (Nov. 2001),556-558.

Maayan, E., et al., "A 512Mb BROM Flash Data Storage: Memory with 8MB/s Data Rate", *ISSCC 2002 / Session 6 / SRAM and Non-Volatile Memories*.(Feb. 2002),4 pages.

Marlid, Bjorn, et al., "Atomic layer deposition of BN thin films", *Thin Solid Films*, 402(1-2), (Jan. 2002),167-171.

Martins, R, "Transport Properties of Doped Silicon Oxycarbide Microcrystalline Films Produced by Spatial Separation Techniques", *Solar Energy Materials and Solar Cells*, 41-42, (1996),493-517.

Martins, R., "Wide Band Gap Microcrystalline Silicon Thin Films", *Diffusion and Defect Data : Solid State Phenomena*, 44-46, Part 1, Scitec Publications,(1995),299-346.

Min, Jae-Sik, et al., "Atomic layer deposition of TiN films by alternate supply of tetrakis (ethylmethylamino)-titanium and ammonia", *Japanese Journal of Applied Physics Part 1—Regular Papers Short Notes & Review Papers*, 37(9A). (Sep. 1998),4999-5004.

Min, J., "Metal-organic atomic-layer deposition of titanium-silicon-nitride films", *Applied Physics Letters*, 75(11), (1999),1521-1523.

Moazzami, R, "Endurance properties of Ferroelectric PZT thin films", *Int. Electron Devices Mtg.*, San Francisco,(1990),417-20.

Moazzami, R, "Ferroelectric PZT thin films for semiconductor memory", *Ph.D Thesis, University of California, Berkeley*, (1991).

Molnar, R., "Growth of Gallium Nitride by Electron-Cyclotron Resonance Plasma-Assisted Molecular-Beam Epitaxy: The Role of Charged Species", *Journal of Applied Physics*, 76(8). (Oct. 1994),4587-4595.

Morishita, S, "Atomic-layer chemical-vapor-deposition of $SiO_2$ by cyclic exposures of $CH_3OSi(NCO)_3$ and $H_2O_2$", *Japanese Journal of Applied Physics Part 1— Regular Papers Short Notes & Review Papers* , 34(10), (Oct. 1995),5738-42.

Moriwaki, Masaru, et al., "Improved metal gate process by simultaneous gate-oxide nitridation during W/WN/sub x/gate formation", *Japanese Journal of Applied Physics Part 1—Regular Papers Short Notes & Review Papers* , 39(4B), (Apr. 2000) ,2177-2180.

Muller, R. S., et al., *In: Device Electronics for Integrated Circuits, Second Edition*, John Wiley & Sons, New York,(1986),p. 157.

Nakajima, Anri, et al., "$NH_3$ annealed atomic-layer-deposited silicon nitride as a high-k gate dielectric with high reliability", *Applied Physics Letters*, 80(7). (Feb. 2002),1252-1254.

Nakjima, Anri, "Soft breakdown free atomic-layer-deposited silicon-nitride $SiO_2$ stack gate dielectrics", *International Electron Devices Meeting. Technical Digest*, (2001),6.5.1-4.

Niilisk, A, "Atomic-scale optical monitoring of the initial growth of TiO2 thin films", *Proceedings of the SPIE—The International Society for Optical Engineering*, 4318. (2001),72-77.

Pankove, J., "Photoemission from GaN", *Applied Physics Letters*, 25(1), (Jul. 1, 1974),53-55.

Park, Jin-Seong, et al., "Plasma-Enhanced Atomic Layer Deposition of Tantaium Nitrides Using Hydrogen Radicals as a Reducing Agent", *Electrochemical & Solid-State Letters*, 4(4), (Apr. 2001),C17-19.

Puurunen, R L., et al., "Growth of aluminum nitride on porous silica by atomic layer chemical vapour deposition", *Applied Surface Science*, 165(2-3), (Sept. 12, 2000),193-202.

Renlund, G. M., "Silicon oxycarbide glasses: Part I. Preparation and chemistry", *J. Mater. Res.*, (Dec. 1991),pp. 2716-2722.

Renlund, G. M., "Silicon oxycarbide glasses: Part II. Structure and properties", *J. Mater. Res.*, vol. 6, No. 12,(Dec. 1991),pp. 2723-2734.

Ritala, Mikko, "Atomic Layer Epitaxy Growth of Titanium, Zirconium and Hafnium Dioxide Thin Films", *Annales Academiae Scientiarum Fennicae*. (1994),24-25.

Robertson, J., "Band offsets of wide-band-gap oxides and implications for future electronic devices", *Journal of Vacuum Science & Technology B* (Microelectronics and Nanometer Structures), 18(3), (May-Jun. 2000),1785-1791.

Shimada, Hiroyuki, et al., "Tantalum nitride metal gate FD-SOI CMOS FETs using low resistivity self-grown bcc-tantalum layer", *IEEE Transactions on Electron Devices*, vol. 48, No. 8. (Aug. 200),1619-1626.

Sneh, Ofer, "Thin film atomic layer deposition equipment for semiconductor processing", *Thin Solid Films*, 402. (2002),248-261.

Song, Hyun-Jung, et al., "Atomic Layer Deposition of $Ta_2 O_5$ Films Using $Ta_2 O_5$ and $NH_3$", *Ultrathin $SiO_2$ and High-K Materials for ULSI Gate Dielectrics. Symposium*, (1999),469-471.

Suntola, T., "Atomic Layer Epitaxy", *Handbook of Crystal Growth, 3; Thin Films of Epitaxy, Part B; Growth Mechanics and Dynamics*. Amsterdam,(1994),601-663.

Suntola, Tuomo, "Atomic layer epitaxy", *Thin Solid Films*, 216(1), (Aug. 28, 1992),84-89.

Sze, S M., "Physics of Semiconductor Devices", *New York : Wiley*. (1981),504-506.

Sze, S M., "Physics of Semiconductor Devices", *New York : Wiley*. (1981),473.

Wei, L S., et al., "Trapping, emission and generation in MNOS memory devices", *Solid-State Electronics*, 17(6). (Jun. 1974),591-8.

White, M H., et al., "Characterization of thin-oxide MNOS memory transistors", *IEEE Transactions on Electron Devices*, ED-19(12). (Dec. 1972),1280-1288.

White, M H., "Direct tunneling in metal-nitride-oxide-silicon (MNOS) structures", *Programme of the 31st physical electronics conference*. (1971), 1.

Wilk, G. D., "High-K gate dielectrics: Current status and materials properties considerations", *Journal of Applied Physics*, 89(10). (May 2001),5243-5275.

Wood, S W., "Ferroelectric memory design", *M.A.Sc. thesis, University of Toronto*. (1992).

Yagishita, Atsushi, et al., "Dynamic threshold voltage damascene metal gate MOSFET (DT-DMG-MOS) with low threshold voltage, high drive current and uniform electrical characteristics", *International Electron Devices Meeting 2000. Technical Digest. IEDM*. (Dec. 2000),663-666.

Yoder, M, "Wide Bandgap Semiconductor Materials and Devices", *IEEE Transactions on Electron Devices*, 43. (Oct. 1996), 1633-1636.

Zhang, H., "Atomic Layer Deposition of High Dielectric Constant Nanolaminates", *Journal of The Electrochemical Society*, 148(4). (Apr. 2001),F63-F66.

Zhu, W J., et al., "Current transport in metal/hafnium oxide/silicon structure", *IEEE Electron Device Letters*, 23, (2002),97-99.

* cited by examiner

MEMORY UTILIZING OXIDE-NITRIDE NANOLAMINATES

CROSS REFERENCE TO RELATED APPLICATIONS

This application is a divisional of U.S. application Ser. No. 10/933,050, filed Sep. 2, 2004, which is a divisional of U.S. application Ser. No. 10/190,689, filed Jul. 8, 2002, both of which are incorporated herein by reference.

This application is related to the following co-pending, commonly assigned U.S. patent applications: "Memory Utilizing Oxide Nanolaminates," Ser. No. 10/190,717, and "Memory Utilizing Oxide-Conductor Nanolaminates," Ser. No. 10/191,336 each of which disclosure is herein incorporated by reference.

FIELD OF THE INVENTION

The present invention relates generally to semiconductor integrated circuits and, more particularly, to gate structures utilizing oxide-nitride nanolaminates.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g a metal oxide semiconducting field effect transistor (MOSFET), coupled to a capacitor cell.

Another type of high speed, low cost memory includes floating gate memory cells. A conventional horizontal floating gate transistor structure includes a source region and a drain region separated by a channel region in a horizontal substrate. A floating gate is separated by a thin tunnel gate oxide. The structure is programmed by storing a charge on the floating gate. A control gate is separated from the floating gate by an intergate dielectric. A charge stored on the floating gate effects the conductivity of the cell when a read voltage potential is applied to the control gate. The state of cell can thus be determined by sensing a change in the device conductivity between the programmed and un-programmed states.

With successive generations of DRAM chips, an emphasis continues to be placed on increasing array density and maximizing chip real estate while minimizing the cost of manufacture. It is further desirable to increase array density with little or no modification of the DRAM optimized process flow.

Multilayer insulators have been previously employed in memory devices. The devices in the above references employed oxide-tungsten oxide-oxide layers. Other previously described structures described have employed charge-trapping layers implanted into graded layer insulator structures.

More recently oxide-nitride-oxide structures have been described for high density nonvolatile memories. All of these are variations on the original MNOS memory structure described by Fairchild Semiconductor in 1969 which was conceptually generalized to include trapping insulators in general for constructing memory arrays.

Studies of charge trapping in MNOS structures have also been conducted by White and others.

Some commercial and military applications utilized non-volatile MNOS memories.

However, these structures did not gain widespread acceptance and use due to their variability in characteristics and unpredictable charge trapping phenomena. They all depended upon the trapping of charge at interface states between the oxide and other insulator layers or poorly characterized charge trapping centers in the insulator layers themselves. Since the layers were deposited by CVD, they are thick, have poorly controlled thickness and large surface state charge-trapping center densities between the layers.

Thus, there is an ongoing need for improved DRAM technology compatible transistor cells. It is desirable that such transistor cells be fabricated on a DRAM chip with little or no modification of the DRAM process flow. It is further desirable that such transistor cells provide increased density and high access and read speeds.

REFERENCES

Boulin et al., "Semiconductor Memory Apparatus with a Multi-Layer Insulator Contacting the Semiconductor," U.S. Pat. No. 3,877,054;

Kahng et al., "Method for Fabricating Multilayer Insulator-Semiconductor Memory Apparatus," U.S. Pat. No. 3,964,085;

DiMaria, D. J., "Graded or Stepped Energy Band-Gap-Insulator MIS structures (GI-MIS or SI-MIS)," Journal of Applied Physics, 50(9), 5826-9 (September 1979);

DeKeersmaecker et al., "Non-Volatile Memory Devices Fabricated From Graded or Stepped Energy Band Gap Insulator MIM or MIS Structure," U.S. Pat. No. 4,217,601, RE31,083;

Eitan, "Non-volatile semiconductor memory cell utilizing asymmetrical charge trapping," U.S. Pat. No. 5,768,192;

Etian, B. et al., "NROM: A Novel Localized Trapping, 2-Bit Nonvolatile Memory Cell," IEEE Electron Device Lett., 21(11), 543-545 (November 2000);

Eitan, B. et al., "Characterization of Channel Hot Electron Injection by the Subthreshold Slope of NROM device, IEEE Electron Device Lett., 22(11), 556-558 (November 2001);

Frohman-Bentchkowsky, D., "An Integrated Metal-Nitride-Oxide-Silicon (MNOS) Memory," Proceedings of the IEEE, 57(6), 1190-2 (June 1969);

Nakamuma et al., "Memory matrix using MIS semiconductor element," U.S. Pat. No. 3,665,423;

Britton, J. et al., "Metal-Nitride-Oxide IC Memory Retains Data for Meter Reader," Electronics, 45(22); 119-23 (23 Oct. 1972);

Cricchi, J. R. et al., "Hardened MNOS/SOS Electrically Reprogrammable Nonvolatile Memory," IEEE Transactions on Nuclear Science, ns-24(6), 2185-9 (December 1977), Conference: IEEE Annual Conference on Nuclear and Space Radiation Effects, Sponsor: IEEE, 12-15 Jul. 1977, Williamsburg, Va., USA;

White, M. H., "Direct Tunneling in Metal-Nitride-Oxide-Silicon (MNOS) Structures," Conference: Program of the 31st physical electronics conference (abstracts), page: 1 pp., Publisher: U.S. Dept. Commerce, Washington, D.C., USA, 1971, viii+46 Pages, Sponsor: American Phys. Soc., division of electron and atomic phys, 15-17 Mar. 1971, Gaithersburg, Md., USA;

White, M. H., Cricchi, J. R., "Characterization of Thin-Oxide MNOS Memory Transistors," IEEE Transactions on Electron Devices, ED-19(12), 1280-8 (December 1972);

Wei, L. S., Simmons, J. G. "Trapping, Emission and Generation in MNOS Memory Devices," Solid-State Electronics, 17(6), 591-8 (June 1974);

Ferris-Prabhu, A. V., "Charge Transfer in Layered Insulators," Solid-State Electronics, 16(9), 1086-7 (September 1973);

Ferris-Prabhu, A. V., Lareau, L. J., "Amnesia in Layered Insulator FET Memory Devices," Conference: 1973 International Electron Devices Meeting Technical Digest, Page: 75-7, Publisher: IEEE, New York, N.Y., USA, 1973, xvi+ 575 Pages, Sponsor: IEEE, 3-5 Dec. 1973, Washington, D.C., USA;

Ferris-Prabhu, A. V., "Tunneling Theories of Non-Volatile Semiconductor Memories," Physica Status Solidi A, 35(1), 243-50 (16 May 1976));

L. Forbes, W. P. Noble and E. H. Cloud, "MOSFET Technology for Programmable Address Decode and Correction," U.S. Pat. No. 6,521,950;

L. Forbes and J. Geusic, "Memory Using Insulator Traps," U.S. Pat. No. 6,140,181; S. M. Sze, "Physics of Semiconductor Devices", John Wiley & Sons, New York (1969);

V. M. Bermudez et al, "The Growth and Properties of Al and AlN Films on GaN," J. Appl. Physics, Vol. 79, No. 1, pp. 110-119, 1996;

Benjamin, M. C., et al, "UV Photoemission Study of Heteroepitaxial AlGaN films Grown on 6H—SiC", IEEE Conference Record, 1996 International Conf. on Plasma Science, Cat. No. 96CH35939, p. 141, 1996; Pankove, J. I., et al, "Photoemission from GaN", Applied Physics Letters, Vol. 25, No. 1, pp. 53-55, 1974);

Pankove, J. I., et al, "Photoemission from GaN", Applied Physics Letters, Vol. 25, No. 1, pp. 53-55, 1974);

Akasaki, I., et al, "Effects of AlN Buffer Layer on Crystallographic Structure and on Electrical and Optical Properties of GaN and Gal-x Alx N Films Grown on Sapphire Substrate by MOVPE", J. of Crystal Growth, Vol. 98, pp. 209-219, 1989, North Holland, Amsterdam;

Molnar, R. J., et al, "Growth of Gallium Nitride by Electron-Cyclotron Resonance Plasma-Assisted Molecular-Beam Epitaxy: The Role of Charged Species", J. of Appl. Phys., Vol. 76, No. 8, pp. 4587-4595, 1994;

Lei, T., et al., "Epitaxial Growth and Characterization of Zinc-Blende Gallium Nitride on Silicon", J. of Appl. Phys., Vol. 71, No. 10, pp. 4933-43, 1992).

A. Yagishita et al., "Dynamic Threshold Voltage Damascene Metal Gate MOSFET (DT-DMG-MOS) With Low Threshold Voltage, High Drive Current and Uniform Electrical Characteristics," Digest Technical Papers Int. Electron Devices Meeting, San Francisco, December 2000, pp. 663-666;

H. Shimada et al., "Tantalum Nitride Metal Gate FD-SOI CMOS FETs Using Low Resistivity Self-Grown BCC-Tantalum layer," IEEE Trans. Electron Devices, Vol. 48, No. 8, pp. 1619-1626, 2000;

M. Moriwaki et al. "Improved Metal Gate Process By Simultaneous Gate-Oxide Nitridation During W/WN/Sub X/Gate Formation," Jpn. J. Appl. Phys., Vol. 39. No. 4B, pp. 2177-2180, 2000;

Jin-Seong Park et al, "Plasma-Enhanced Atomic Layer Deposition of Tantalum Nitrides Using Hydrogen Radicals as a Reducing Agent", Electrochemical and Solid-State Lett., 4(4) C17-C19, 2001;

Petra Alen et al., "Atomic Layer Deposition of Ta(al)N© Thin Films Using Trimethylaluminum as a Reducing Agent", Jour, of the Electrochemical Society, 148 (10), G566-G571 (2001);

J.-S. Min et al., "Atomic Layer Deposition of TiN Films by Alternate Supply on Tetrakis (Ethylmethyllamino)-Titanium and Ammonia," Jpn. J. Appl. Phys., Vol. 37, Part 1, No. 9A, pp. 4999-5004, 15 Sep. 1998;

Jaehyong Koo et al., "Study on the Characteristics of TiAlN Thin Film Deposited by Atomic Layer Deposition Method," J. Vac. Sci. Technol. A, 19(6), 2831-2834 (2001);

Jae-Sik Min et al, "Metal-Organic Atomic-Layer Deposition of Titanium-Silicon-Nitride Films", Appl. Phys, Lett., Vol. 75, No. 11, 1521-1523 (1999);

Bjorn Marlid et al, "Atomic layer deposition of BN thin films", Thin Solid Films, 402, 167-171 (2002);

Anri Nakajima et al, "NH3-Annealed Atomic-Layer-Deposited Silicon Nitride as a High-K Gate Dielectric The High Reliability", Appl. Phys. Lett., 80 (7), 1252-1254 (2002);

Anri Nakajima et al, "Soft Breakdown Free Atomic-Layer-Deposited Silicon-Nitride/SiO2 Stack Gate Dielectrics", Technical Digest of International Electron Devices Meeting, page 01-133-134 (2001);

J. W. Kraus et al, "Atomic Layer Deposition of Tungsten Nitride Films Using Sequential Surface Reactions", 147 (3) 1175-1181 (2000);

R. L. Pruurunen et al, "Growth of Aluminum Nitride on Porous Silica by Atomic Layer Chemical Vapor Deposition", Applied Surface Science, 165, 193-202 (2000);

C. Adelmann et al, "Atomic-Layer Epitaxy of GaN Quantum Well and Quantum Dots an (0001) AlN", Jour. Appl. Phys., Vol. 91, No. 8, pp. 5498-5500 (2002).

DETAILED DESCRIPTION

Figure 1A:
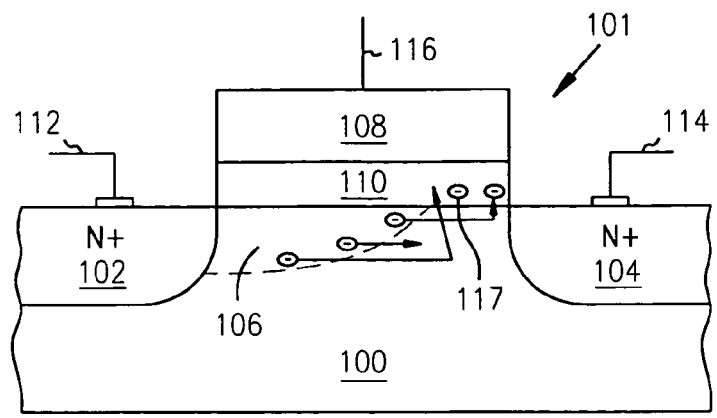
FIG. 1A is a block diagram of a metal oxide semiconductor field effect transistor (MOSFET) in a substrate according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is useful in illustrating the conventional operation of a MOSFET such as can be used in a DRAM array. FIG. 1A illustrates the normal hot electron injection and degradation of devices operated in the forward direction. As is explained below, since the electrons are trapped near the drain they are not very effective in changing the device characteristics.

FIG. 1A is a block diagram of a metal oxide semiconductor field effect transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
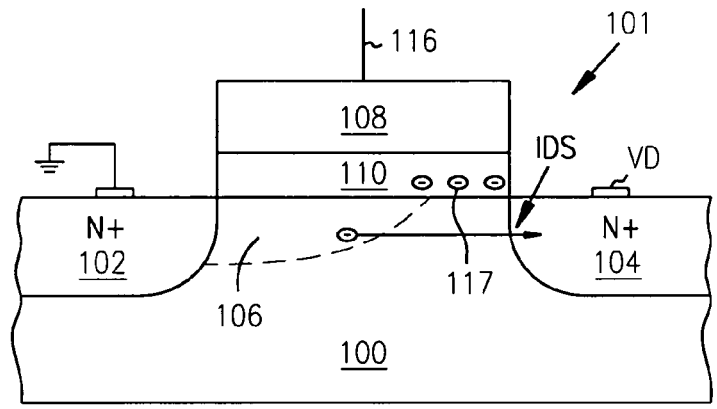
FIG. 1B illustrates the MOSFET of FIG. 1A operated in the forward direction showing some degree of device degradation due to electrons being trapped in the gate oxide near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
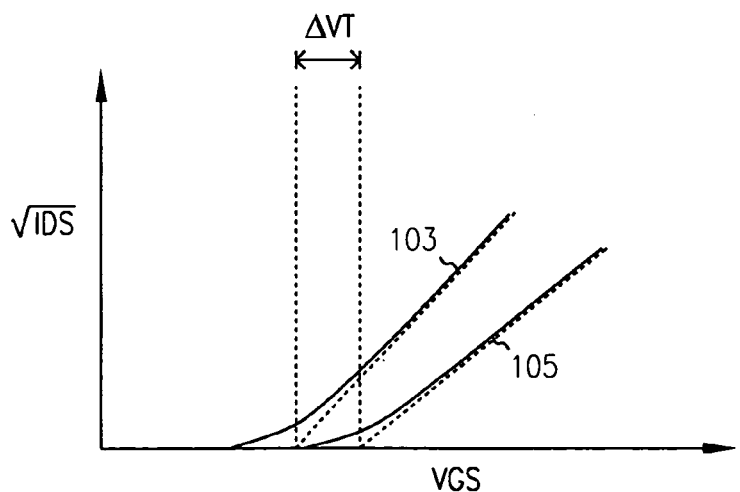
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The change in the slope of the plot of $\sqrt{Ids}$ versus VGS represents the change in the charge carrier mobility in the channel 106.

In FIG. 1C, ΔVT represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 103 represents the charge carrier mobility in the channel 106 for FIG. 1A having no electrons trapped in the gate oxide 110. Slope 105 represents the charge mobility in the channel 106 for the conventional MOSFET of FIG. 1B having electrons 117 trapped in the gate oxide 110 near the drain region 104. As shown by a comparison of slope 103 and slope 105 in FIG. 1C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

One of the inventors, along with others, has previously described programmable memory devices and functions based on the reverse stressing of MOSFET's in a conventional CMOS process and technology in order to form programmable address decode and correction in the U.S. Pat. No. 6,521,950 entitled, "MOSFET Technology for Programmable Address Decode and Correction.". That disclosure, however, did not describe write once read only memory solutions, but rather address decode and correction issues. One of the inventors also describes write once read only memory cells employing charge trapping in gate insulators for conventional MOSFETs and write once read only memory employing floating gates. The same are described in co-pending, commonly assigned U.S. patent applications, entitled "Write Once Read Only Memory Employing Charge Trapping in Insulators," Ser. No. 10/177,077 and "Write Once Read Only Memory Employing Floating Gates," Ser. No. 10/177,083. The present application, however, describes transistor cells having oxide-nitride nanolaminate layers and used in integrated circuit device structures.

According to the teachings of the present invention, transistor cells can be programmed by operation in the reverse direction and utilizing avalanche hot electron injection to trap electrons in oxide-nitride nanolaminate layers of the transistor. When the programmed transistor is subsequently operated in the forward direction the electrons trapped in the oxide-nitride nanolaminate layers cause the channel to have a different threshold voltage. The novel programmed transistors of the present invention conduct significantly less current than conventional transistor cells which have not been programmed. These electrons will remain trapped in the oxide-nitride nanolaminate layers unless negative control gate voltages are applied. The electrons will not be removed from the oxide-nitride nanolaminate layers when positive or zero control gate voltages are applied. Erasure can be accomplished by applying negative gate voltages and/or increasing the temperature with negative gate bias applied to cause the trapped electrons in the oxide-nitride nanolaminate layers to be re-emitted back into the silicon channel of the transistor.

Figure 2A:
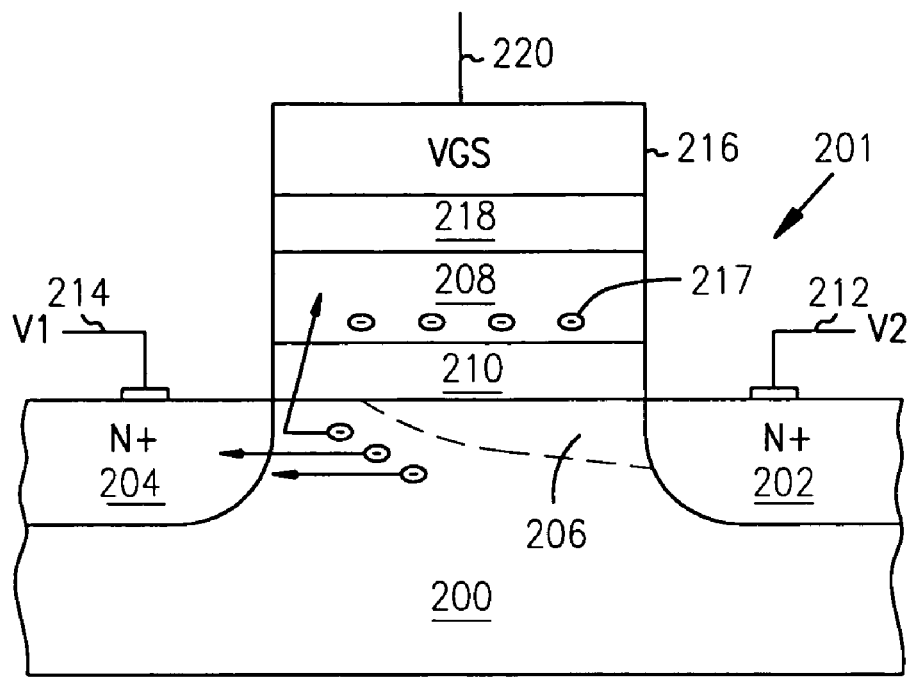
FIG. 2A is a diagram of an embodiment for a programmed transistor, having oxide-nitride nanolaminate layers, which can be used as a transistor cell according to the teachings of the present invention.

FIG. 2A is a diagram of an embodiment for a programmed transistor cell 201 having oxide-nitride nanolaminate layers according to the teachings of the present invention. As shown in FIG. 2A the transistor cell 201 includes a transistor in a substrate 200 which has a first source/drain region 202, a second source/drain region 204, and a channel region 206 between the first and second source/drain regions, 202 and 204. In one embodiment, the first source/drain region 202 includes a source region 202 for the transistor cell 201 and the second source/drain region 204 includes a drain region 204 for the transistor cell 201. FIG. 2A further illustrates the transistor cell 201 having oxide-nitride nanolaminate layers 208 separated from the channel region 206 by a first oxide 210. An sourceline or array plate 212 is coupled to the first source/drain region 202 and a transmission line 214 is coupled to the second source/drain region 204. In one embodiment, the transmission line 214 includes a bit line 214. Further as shown in FIG. 2A, a gate 216 is separated from the oxide-nitride nanolaminate layers 208 by a second oxide 218.

As stated above, transistor cell 201 illustrates an embodiment of a programmed transistor. This programmed transistor has a charge 217 trapped in potential wells in the oxide-nitride nanolaminate layers 208 formed by the different electron affinities of the insulators 208, 210 and 218. In one embodiment, the charge 217 trapped in the oxide-nitride nanolaminate layers 208 includes a trapped electron charge 217.

Figure 2B:
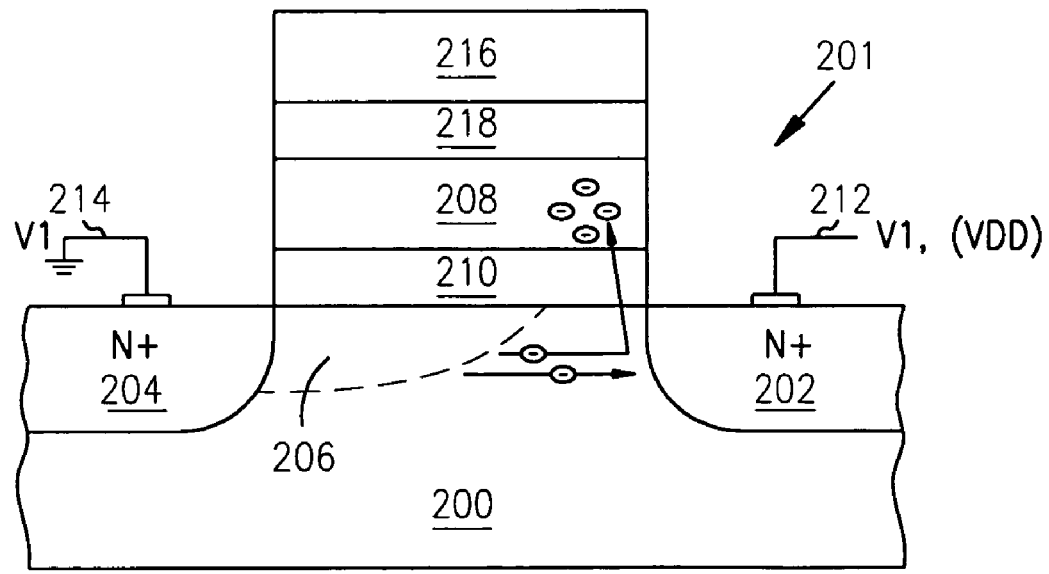
FIG. 2B is a diagram suitable for explaining a method embodiment by which a transistor, having oxide-nitride nanolaminate layers, can be programmed to achieve the embodiments of the present invention.

FIG. 2B is a diagram suitable for explaining the method by which the oxide-nitride nanolaminate layers 208 of the transistor cell 201 of the present invention can be programmed to achieve the embodiments of the present invention. As shown in FIG. 2B the method includes programming the transistor. Programming the transistor includes applying a first voltage potential V1 to a drain region 204 of the transistor and a second voltage potential V2 to the source region 202.

In one embodiment, applying a first voltage potential V1 to the drain region 204 of the transistor includes grounding the drain region 204 of the transistor as shown in FIG. 2B. In this embodiment, applying a second voltage potential V2 to the source region 202 includes biasing the array plate 212 to a voltage higher than VDD, as shown in FIG. 2B. A gate potential VGS is applied to the control gate 216 of the transistor. In one embodiment, the gate potential VGS includes a voltage potential which is less than the second voltage potential V2, but which is sufficient to establish conduction in the channel 206 of the transistor between the drain region 204 and the source region 202. As shown in FIG. 2B, applying the first, second and gate potentials (V1, V2, and VGS respectively) to the transistor creates a hot electron injection into the oxide-nitride nanolaminate layers 208 of the transistor adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the oxide-nitride nanolaminate layers 208 adjacent to the source region 202. Here the charge carriers become trapped in potential wells in the oxide-nitride nanolaminate layers 208 formed by the different electron affinities of the insulators 208, 210 and 218.

In an alternative embodiment, applying a first voltage potential V1 to the drain region 204 of the transistor includes biasing the drain region 204 of the transistor to a voltage higher than VDD. In this embodiment, applying a second voltage potential V2 to the source region 202 includes grounding the sourceline or array plate 212. A gate potential VGS is applied to the control gate 216 of the transistor. In one embodiment, the gate potential VGS includes a voltage potential which is less than the first voltage potential V1, but which is sufficient to establish conduction in the channel 206 of the transistor between the drain region 204 and the source region 202. Applying the first, second and gate potentials (V1, V2, and VGS respectively) to the transistor creates a hot electron injection into the oxide-nitride nanolaminate layers 208 of the transistor adjacent to the drain region 204. In other words, applying the first, second and gate potentials (V1, V2, and VGS respectively) provides enough energy to the charge carriers, e.g. electrons, being conducted across the channel 206 that, once the charge carriers are near the drain region 204, a number of the charge carriers get excited into the oxide-nitride nanolaminate layers 208 adjacent to the drain region 204. Here the charge carriers become trapped in potential wells in the oxide-nitride nanolaminate layers 208 formed by the different electron affinities of the insulators 208, 210 and 218, as shown in FIG. 2A.

In one embodiment of the present invention, the method is continued by subsequently operating the transistor in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the oxide-nitride nanolaminate layers 208. That is, a gate potential can be applied to the gate 216 by a wordline 220 in an effort to form a conduction channel between the source and the drain regions as done with addressing and reading conventional DRAM cells.

However, now in its programmed state, the conduction channel 206 of the transistor will have a higher voltage threshold and will not conduct.

Figure 2C:
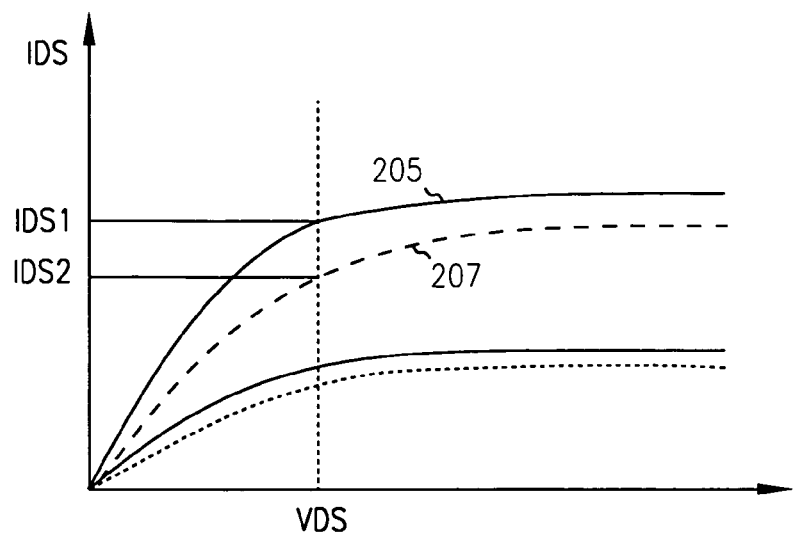
FIG. 2C is a graph plotting the current signal (Ids) detected at the drain region versus a voltage potential, or drain voltage, (VDS) set up between the drain region and the source region (Ids vs. VDS).

FIG. 2C is a graph plotting a current signal (IDS) detected at the second source/drain region 204 versus a voltage potential, or drain voltage, (VDS) set up between the second source/drain region 204 and the first source/drain region 202 (IDS vs. VDS). In one embodiment, VDS represents the voltage potential set up between the drain region 204 and the source region 202. In FIG. 2C, the curve plotted as 205 represents the conduction behavior of a conventional transistor where the transistor is not programmed (is normal or not stressed) according to the teachings of the present invention. The curve 207 represents the conduction behavior of the programmed transistor (stressed), described above in connection with FIG. 2A, according to the teachings of the present invention. As shown in FIG. 2C, for a particular drain voltage, VDS, the current signal (IDS2) detected at the second source/drain region 204 for the programmed transistor (curve 207) is significantly lower than the current signal (IDS1) detected at the second source/drain region 204 for the conventional transistor cell (curve 205) which is not programmed according to the teachings of the present invention. Again, this is attributed to the fact that the channel 206 in the programmed transistor of the present invention has a different voltage threshold.

Some of these effects have recently been described for use in a different device structure, called an NROM, for flash memories. This latter work in Israel and Germany is based on employing charge trapping in a silicon nitride layer in a non-conventional flash memory device structure. Charge trapping in silicon nitride gate insulators was the basic mechanism used in MNOS memory devices, charge trapping in aluminum oxide gates was the mechanism used in MIOS memory devices, and one of the present inventors, along with another, has previously disclosed charge trapping at isolated point defects in gate insulators. However, none of the above described references addressed forming transistor cells utilizing charge trapping in potential wells in oxide-nitride nanolaminate layers formed by the different electron affinities of the insulators.

Figure 3:
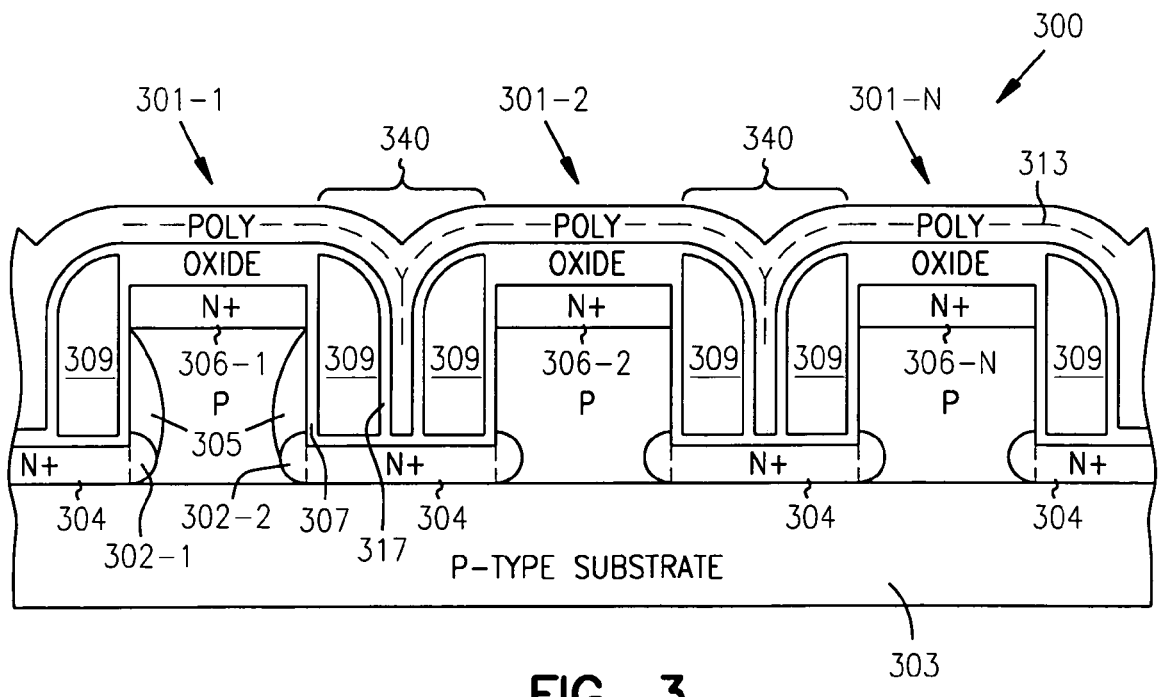
FIG. 3 illustrates a portion of an embodiment of a memory array according to the teachings of the present invention.

FIG. 3 illustrates an embodiment for a portion of a memory array 300 according to the teachings of the present invention. The memory in FIG. 3, is shown illustrating a number of vertical pillars, or transistor cells, 301-1, 301-2, ..., 301-N, formed according to the teachings of the present invention. As one of ordinary skill in the art will appreciate upon reading this disclosure, the number of vertical pillar are formed in rows and columns extending outwardly from a substrate 303. As shown in FIG. 3, the number of vertical pillars, 301-1, 301-2, ..., 301-N, are separated by a number of trenches 340. According to the teachings of the present invention, the number of vertical pillars, 301-1, 301-2, ..., 301-N, serve as transistors including a first source/drain region, e.g. 302-1 and 302-2 respectively. The first source/drain region, 302-1 and 302-2, is coupled to a sourceline 304. As shown in FIG. 3, the sourceline 304 is formed in a bottom of the trenches 340 between rows of the vertical pillars, 301-1, 301-2, ..., 301-N. According to the teachings of the present invention, the sourceline 304 is formed from a doped region implanted in the bottom of the trenches 340. A second source/drain region, e.g. 306-1 and 306-2 respectively, is coupled to a bitline (not shown). A channel region 305 is located between the first and the second source/drain regions.

As shown in FIG. 3, oxide-nitride nanolaminate layers, shown generally as 309, are separated from the channel region 305 by a first oxide layer 307 in the trenches 340 along rows of the vertical pillars, 301-1, 301-2, ..., 301-N. In the embodiment shown in FIG. 3, a wordline 313 is formed across the number of pillars and in the trenches 340 between the oxide-nitride nanolaminate layers 309. The wordline 313 is separated from the pillars and the oxide-nitride nanolaminate layers 309 by a second oxide layer 317.

Figure 4:
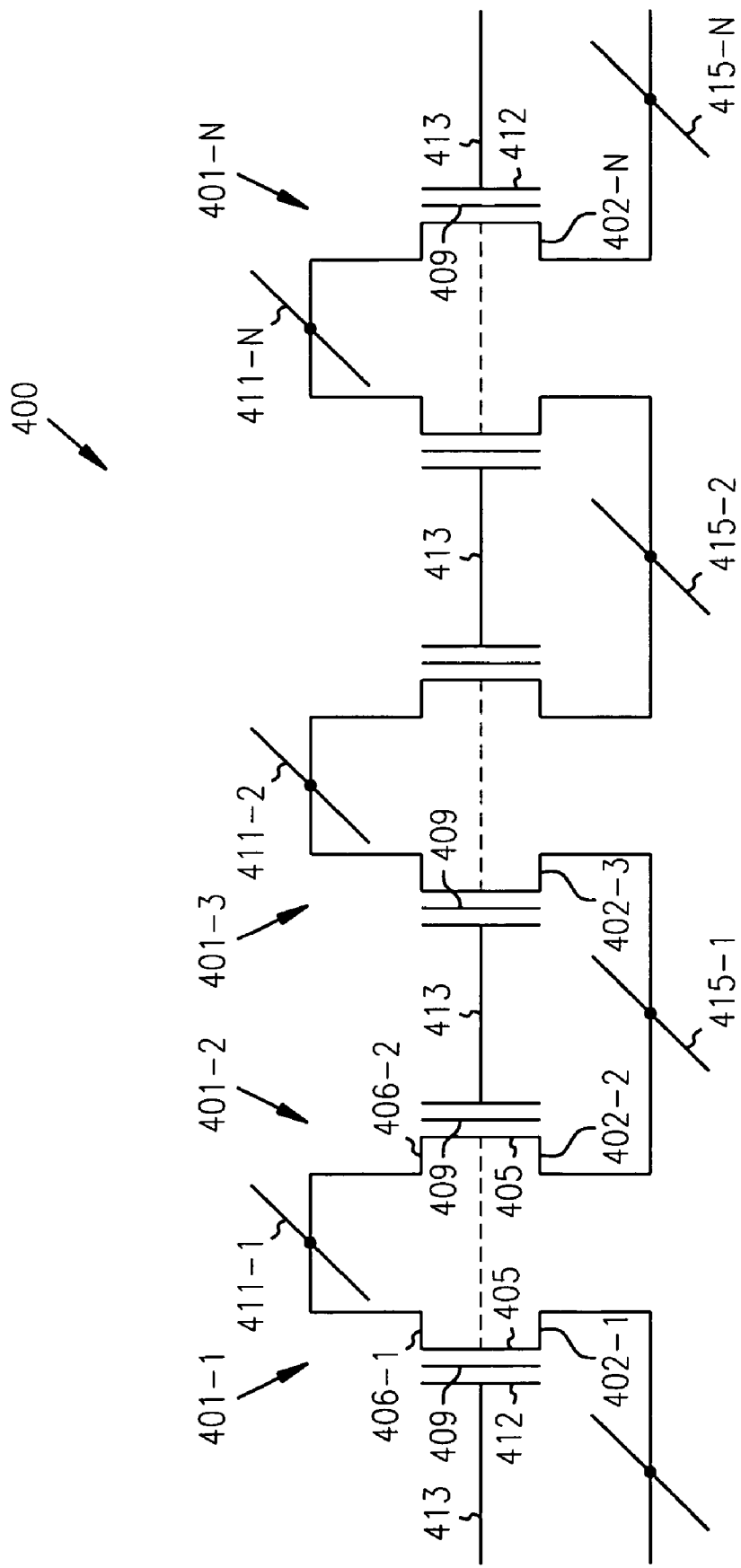
FIG. 4 illustrates an embodiment of an electrical equivalent circuit for the portion of the memory array shown in FIG. 3.

FIG. 4 illustrates an electrical equivalent circuit 400 for the portion of the memory array shown in FIG. 3. As shown in FIG. 4, a number of vertical transistor cells, 401-1, 401-2, ..., 401-N, are provided. Each vertical transistor cell, 401-1, 401-2, ..., 401-N, includes a first source/drain region, e.g. 402-1 and 402-2, a second source/drain region, e.g. 406-1 and 406-2, a channel region 405 between the first and the second source/drain regions, and oxide-nitride nanolaminate layers, shown generally as 409, separated from the channel region by a first oxide layer.

FIG. 4 further illustrates a number of bit lines, e.g. 411-1 and 411-2. According to the teachings of the present invention as shown in the embodiment of FIG. 4, a single bit line, e.g. 411-1 is coupled to the second source/drain regions, e.g. 406-1 and 406-2, for a pair of transistor cells 401-1 and 401-2 since, as shown in FIG. 3, each pillar contains two transistor cells. As shown in FIG. 4, the number of bit lines, 411-1 and 411-2, are coupled to the second source/drain regions, e.g. 406-1 and 406-2, along rows of the memory array. A number of word lines, such as wordline 413 in FIG. 4, are coupled to a gate 412 of each transistor cell along columns of the memory array. According to the teachings of the present invention, a number of sourcelines, 415-1, 415-2, ..., 415-N, are formed in a bottom of the trenches between rows of the vertical pillars, described in connection with FIG. 3, such that first source/drain regions, e.g. 402-2 and 402-3, in column adjacent transistor cells, e.g. 401-2 and 401-3, separated by a trench, share a common sourceline, e.g. 415-1. And additionally, the number of sourcelines, 415-1, 415-2, ..., 415-N, are shared by column adjacent transistor cells, e.g. 401-2 and 401-3, separated by a trench, along rows of the memory array 400. In this manner, by way of example and not by way of limitation referring to column adjacent transistor cells, e.g. 401-2 and 401-3, separated by a trench, when one column adjacent transistor cell, e.g. 401-2, is being read its complement column adjacent transistor cell, e.g. 401-3, can operate as a reference cell.

Figure 5:
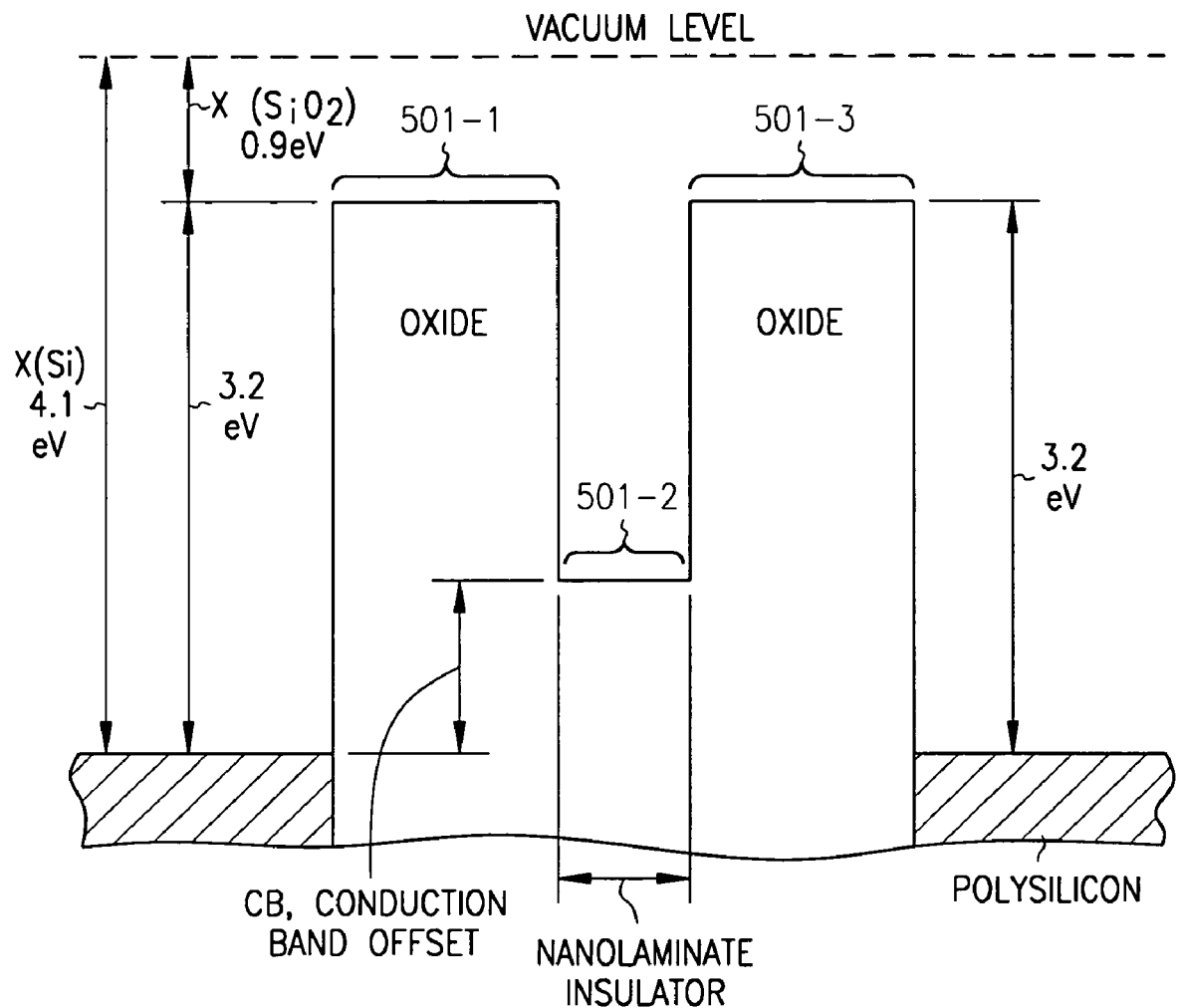
FIG. 5 illustrates an energy band diagram for an embodiment of a gate stack according to the teachings of the present invention.

FIG. 5 illustrates an energy band diagram for an embodiment of a gate stack according to the teachings of the present invention. As shown in FIG. 5, the embodiment consists of insulator stacks, 501-1, 501-2 and 501-3, e.g. $SiO_2$/oxide-nitride nanolaminate layers/$SiO_2$. The first and the last layer, 501-1 and 501-2, are done by atomic layer deposition. The disclosure describes the fabrication by atomic layer deposition, ALD, and use of oxide-nitride-oxide nanolaminates, as shown in FIG. 5, and consisting of the nitride materials, shown in FIG. 6, as follows:
(i) silicon nitride
(ii) aluminum nitride
(iii) gallium nitride
(iv) gallium aluminum nitride
(v) tantalum aluminum nitride
(vi) titanium silicon nitride
(vii) titanium aluminum nitride
(viii) tungsten aluminum nitride In embodiments of the invention, these nitride material are of the order of 4 nanometers in thickness, with a range of 1 to 10 nm. The compositions of these materials are adjusted so as that they have an electron affinity less than silicon which is 4.1 eV, resulting in a positive conduction band offset as shown in FIG. 5. The materials can be deposited by ALD as described in the next section.

Figure 6:
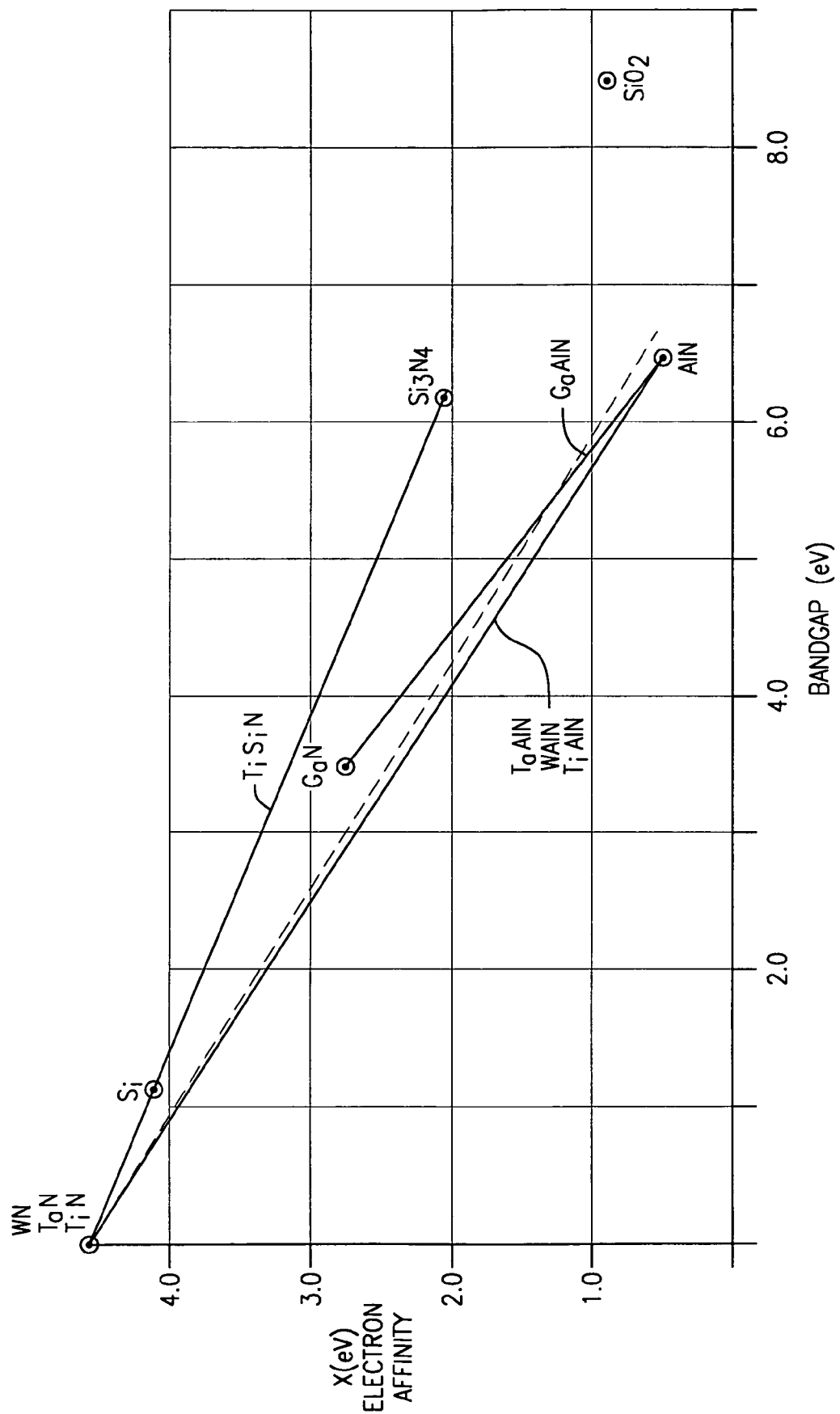
FIG. 6 is a graph which plots electron affinity versus the energy bandgap for various insulators.

FIG. 6 illustrates how the electron affinity varies with composition ratio of the compound materials. These results have been superimposed upon the graph of the values for the electron affinities of the common materials, silicon. This difference in electron affinities for instance creates the barrier between silicon and oxide of around 3.2 eV. Generally it is observed that as the bandgap of materials increases the electron affinity decreases.

The electron affinity of GaN is the subject of numerous reports.

AlN is a low electron affinity material. For example, UV photoemission measurements of the surface and interface properties of heteroepitaxial AlGaN on 6H—SiC grown by organometallic vapor phase epitaxy (OMVPE) show a low positive electron affinity for Al/sub 0.55/Ga/sub 0.45/N sample and GaN, whereas the AlN samples exhibited the characteristics of negative electron affinity. On the other hand, in semi-insulating and degenerate n-type GaN samples prepared by chemical vapor deposition with heat-cleaned surface the electron affinity was found to lie between 4.1 and 2.1 eV.

Assuming the electron affinity of GaN to be around 2.7 eV, the electron affinity decreases for GaAlN as the aluminum composition increases until the material becomes AlN which has a lower electron affinity of around 0.6 eV as shown in FIG. 6.

Titanium nitride, tantalum nitride and tungsten nitride are mid-gap work function metallic conductors commonly described for use in CMOS devices.

Method of Formation

This disclosure describes the use of oxide-nitride nanolaminate layers with charge trapping in potential wells formed by the different electron affinities of the insulator layers. These layers formed by ALD are of atomic dimensions, or nanolaminates, with precisely controlled interfaces and layer thickness. Operation of the device specifically depends on and utilizes the electron affinity of the nitride layer being higher than that of silicon oxide. This creates a potential energy well in the multi-layer nanolaminate gate insulator structure.

Atomic Layer Deposition of Nitrides

Ta—N: Plasma-enhanced atomic layer deposition (PEALD) of tantalum nitride (Ta—N) thin films at a deposition temperature of 260° C. using hydrogen radicals as a reducing agent for Tertbutylimidotris(diethylamido) tantalum have been described. The PEALD yields superior Ta—N films with an electric resistivity of 400 $\mu\Omega$cm and no aging effect under exposure to air. The film density is higher than that of Ta—N films formed by typical ALD, in which $NH_3$ is used instead of hydrogen radicals. In addition, the as-deposited films are not amorphous, but rather polycrystalline structure of cubit TaN. The density and crystallinity of the films increases with the pulse time of hydrogen plasma. The films are Ta-rich in composition and contain around 15 atomic % of carbon impurity. In the PEALD of Ta—N films, hydrogen radicals are used a reducing agent instead of $NH_3$, which is used as a reactant gas in typical Ta—N ALD. Films are deposited on $SiO_2$ (100 nm)/Si wafers at a deposition temperature of 260° C. and a deposition pressure of 133 Pa in a cold-walled reactor using $(Net_2)_3$ Ta=Nbu$^t$ [tertbutylimidotris(diethylamido)tantalum, TBTDET] as a precursor of Ta. The liquid precursor is contained in a bubbler heated at 70° C. and carried by 35 sccm argon. One deposition cycle consist of an exposure to a metallorganic precursor of TBTDET, a purge period with Ar, and an exposure to hydrogen plasma, followed by another purge period with Ar. The Ar purge period of 15 seconds instead between each reactant gas pulse isolates the reactant gases from each other. To ignite and maintain the hydrogen plasma synchronized with the deposition cycle, a rectangular shaped electrical power is applied between the upper and lower electrode. The showerhead for uniform distribution of the reactant gases in the reactor, capacitively coupled with an rf (13.56 MHz) plasma source operated at a power of 100 W, is used as the upper electrode. The lower electrode, on which a wafer resides, is grounded. Film thickness and morphology were analyzed by field emission scanning electron microscopy.

Ta(Al)N(C): Technical work on thin films have been studied using $TaCl_5$ or $TaBr_5$ and $NH_3$ as precursors and $Al(CH_3)_3$ as an additional reducing agent. The deposition temperature is varied between 250 and 400° C. The films contained aluminum, carbon, and chlorine impurities. The chlorine content decreased drastically as the deposition temperature is increased. The film deposited at 400° C. contained less than 4 atomic % chlorine and also had the lowest resistivity, 1300 $\mu\Omega$cm. Five different deposition processes with the pulsing orders $TaCl_5$-TMA-$NH_3$, TMA-$TaCl_5$—$NH_3$, $TaBr_5$—$NH_3$, $TaBr_5$—Zn—$NH_3$, and $TaBr_5$-TMA-$NH_3$ are used. $TaCl_5$, $TaBr_5$, and Zn are evaporated from open boats held inside the reactor. The evaporation temperatures for $TaCl_4$, $TaBr_5$, and Zn are 90, 140, 380° C., respectively. Ammonia is introduced into the reactor through a mass flowmeter, a needle valve, and a solenoid valve. The flow rate is adjusted to 14 sccm during a continuous flow. TMA is kept at a constant temperature of 16° C. and pulsed through the needle and solenoid valve. Pulse times are 0.5 s for $TaCl_5$, $TaBr_5$, $NH_3$, and Zn whereas the pulse length of TMA is varied between 0.2 and 0.8 s. The length of the purge pulse is always 0.3 s. Nitrogen gas is used for the transportation of the precursor and as a purging gas. The flow rate of nitrogen is 400 sccm.

TiN: Atomic layer deposition (ALD) of amorphous TiN films on $SiO_2$ between 170° C. and 210° C. has been achieved by the alternate supply of reactant sources, Ti[N(C2H5CH3)2]4 [tetrakis(ethylmethylamino)titanium: TEMAT] and NH3. These reactant sources are injected into the reactor in the following order: TEMAT vapor pulse, Ar gas pulse, NH3 gas pulse and Ar gas pulse. Film thickness per cycle saturated at around 1.6 monolayers per cycle with sufficient pulse times of reactant sources at 200° C. The results suggest that film thickness per cycle could exceed 1 ML/cycle in ALD, and are explained by the rechemisorption mechanism of the reactant sources. An ideal linear relationship between number of cycles and film thickness is confirmed.

TiAlN: Koo et al published paper on the study of the characteristics of TiAlN thin film deposited by atomic layer deposition method. The series of metal-Si—N barriers have high resistivity above 1000 $\mu\Omega$cm. They proposed another ternary diffusion barrier of TiAlN. TiAlN film exhibited a NaCl structure in spite of considerable Al contents. TiAlN films are deposited using the $TiCl_4$ and dimethylaluminum hydride ethypiperdine (DMAH-EPP) as the titanium and aluminum precursors, respectively. $TiCl_4$ is vaporized from the liquid at 13-15° C. and introduced into the ALD chamber, which is supplied by a bubbler using the Ar carrier gas with a flow rate of 30 sccm. The DMAH-EPP precursor is evaporated at 60° C. and introduced into the ALD chamber with the same flow rate of $TiCl_4$. The $NH_3$ gas is also used as a reactant gas and its flow rate is about 60 sccm. Ar purging gas is introduced for the complete separation of the source and reactant gases. TiAlN films are deposited at the temperatures between 350 and 400° C. and total pressure is kept constant to be two torr.

TiSiN: Metal-organic atomic-layer deposition (MOALD) achieves near-perfect step coverage step and control precisely the thickness and composition of grown thin films. A MOALD technique for ternary Ti—Si—N films using a sequential supply of $Ti[N(CH_3)_2]_4$ [tetrakis (dimethylamido) titanium: TDMAT], silane ($SiH_4$), and ammonia ($NH_3$), has been developed and evaluated the Cu diffusion barrier characteristics of a 10 nm Ti—Si—N film with high-frequency C-V measurements. At 180° C. deposition temperature, silane is supplied separately in the sequence of the TDMAT pulse, silane pulse, and the ammonia pulse. The silicon content is the deposited films and the deposition thickness per cycle remained almost constant at 18 at. % and 0.22 nm/cycle, even though the silane partial pressure varied from 0.27 to 13.3 Pa. Especially, the Si content dependence is sirikingly different from the conventional chemical-vapor deposition. Step coverage is approximately 100% even on the 0.3 $\mu$m diameter hole with slightly negative slope and 10:1 aspect ratio.

BN: Boron nitride has for the first time been deposited from gaseous $BBr_3$ and $NH_3$ by means of atomic layer deposition. The films deposited at 750° C. and total pressure of 10 torr on silica substrates showed a turbostratic with a c-axis at 0.7 nm. The film deposited at 400° C. are significantly less ordered. The film density is obtained by means of X-ray reflectivity, and it is found to be 1.65-1.7 and 1.9-1.95 g cm$^{-3}$ for the films deposited at 400 and 750° C., respectively. Furthermore, the films are, regardless of deposition temperature, fully transparent and very smooth. The surface roughness is 0.2-0.5 nm as measured by optical interferometry.

Silicon Nitride: Very recently extremely thin silicon nitride high-k (k=7.2) gate dielectrics have been formed at low temperature (<550° C.) by an atomic-layer-deposition technique with subsequent $NH_3$ annealing at 550° C. A remarkable reduction in leakage current, especially in the low dielectric voltage region, which will be operating voltage for future technologies, has made it a highly potential gate dielectric for future ultralarge-scale integrated devices. Suppressed soft breakdown events are observed in ramped voltage stressing. This suppression is thought to be due to a strengthened structure of S—N bonds and the smoothness and uniformity at the poly-Si/ALD-silicon-nitride interface. The wafers are cleaned with a $NH_4OH:H_2O_2:H_2O$=0.15:3:7 solution at 80° C. for 10 min and terminated with hydrogen in 0.5% HF solution to suppress the native oxidation. The silicon-nitride gate dielectrics are deposited by alternately supplying $SiCl_4$ and $NH_3$ gases. The $SiCl_4$ exposure at 340-375° C. followed by $NH_3$ exposure at 550° C. is cyclically repeated 20 times. The gas pressure of $SiCl_4$ and $NH_3$ during the deposition is 170 and 300 Torr, respectively. Just after the ALD, $NIH_3$ annealing is carried out for 90 min at 550° C. The $T_{eq}$ value of the ALD silicon-nitride is determined to be 1.2±0.2 nm from the ratio of the accumulation capacitances of the silicon nitride and the $SiO_2$ samples.

Silicon-Nitride/$SiO_2$: An extremely-thin (0.3-0.4 nm) silicon nitride layer has been deposited on thermally grown $SiO_2$ by an atomic-layer-deposition technique. The boron penetration through the stack gate dielectric has been dramatically suppressed and the reliability has been significantly improved. An exciting feature of no soft breakdown (SBD) events is observed in ramped voltage stressing and time-dependent dielectric breakdown (TDDB) characteristics. After the thermal growth of 2.0 to 3.0 nm thick gate oxides on a Si (001) substrates, silicon nitride layer is deposited by alternately supplying $SiCl_4$ and $NH_3$ gases. The $SiCl_4$ exposure at 375° C. followed by $NH_3$ exposure at 550° C. is cyclically repeated five times, leading to a silicon nitride thickness of 0.3-0.4 nm. The thickness of the ALD silicon nitride is confirmed to be controlled with an atomic layer level by the number of the deposition cycle.

WN: Tungsten nitride films have been deposited with the atomic layer control using sequential surface reactions. The tungsten nitride film growth is accomplished by separating the binary reaction $2WF_6+NH_3->W_2N+3HF+9/2\ F_2$ into two half-reactions. Successive application of the $WF_6$ and $NH_3$ half-reactions in an ABAB . . . sequence produced tungsten nitride deposition at substrate temperatures between 600 and 800 K. Transmission Fourier transform infrared (FTIR) spectroscopy monitored the coverage of $WF_x$* and $NH_y$* surface species on high surface area particles during the $WF_6$ and $NH_3$ half-reactions. The FTIR spectroscope results demonstrated the $WF_6$ and $NH_3$ half-reactions are complete and self-limiting at temperatures >600 K. In situ spectroscopic ellipsometry monitored the film growth on Si(100) substrate vs. temperature and reactant exposure. A tungsten nitride deposition rate of 2.55 Å/AB cycle is measured at 600-800 K for $WF_6$ and $NH_3$ reactant exposure >3000 L and 10,000 L, respectively. X-ray photoelectron spectroscopy depth-profiling experiments determined that the films had a $W_2N$ stoichiometry with low C and O impurity concentrations. X-ray diffraction investigations revealed that the tungsten nitride films are microcrystalline. Atomic force microscopy measurements of the deposited films observed remarkably flat surface indicating smooth film growth. These smooth tungsten nitride films deposited with atomic layer control should be used as diffusion control for Cu on contact and via holes.

AlN: Aluminum nitride (AlN) has been grown on porous silica by atomic layer chemical vapor deposition (ALCVD) from trimethylaluminum (TMA) and ammonia precursors. The ALCVD growth is based on alternating, separated, saturating reactions of the gaseous precursors with the solid substrates. TMA and ammonia are reacted at 423 and 623 Kelvin (K), respectively, on silica which has been dehydroxylated at 1023 K pretreated with ammonia at 823 K. The growth in three reaction cycles is investigated quntitatively by elemental analysis, and the surface reaction products are identified by IR and solid state and Si NMR measurements. Steady growth of about 2 aluminum atoms/$nm^2_{silica\ A}$/reaction cycle is obtained. The growth mainly took place through (I) the reaction of TMA which resulted in surface Al-Me and Si-Me groups, and (II) the reaction of ammonia which replaced aluminium-bonded methyl groups with amino groups. Ammonia also reacted in part with the silicon-bonded methyl groups formed in the dissociated reaction of TMA with siloxane bridges. TMA reacted with the amino groups, as it did with surface silanol groups and siloxane bridges. In general, the Al—N layer interacted strongly with the silica substrates, but in the third reaction cycle AlN-type sites may have formed.

GaN: Pseudo substrates of GaN templates have been grown by MOCVD on sapphire, apart from the quantum dot samples, which are grown on bulk 6H—SiC. Prior to GaN ALE, about 400-nm-thick fully relaxed AlN layers are deposited on all substrates. The $N_2$ flux has been fixed to 0.5 sccm and the rf power to 300 W, which leads to maximum AlN and GaN growth rates of about 270 nm/h under N-limited metal-rich conditions. The Ga flux has been calibrated by measuring the GaN growth rate under N-rich conditions using reflection high-energy electron diffraction (RHEED) oscillations at $T_s$=650° C., where it is safe to assume that the Ga sticking coefficient is unity.

Memory Devices

According to the teachings of the present invention, the gate insulator structure shown in FIG. 5 is employed in a wide variety of different flash memory type devices. That is, in embodiments of the present invention, the gate structure embodiment of FIG. 5, having silicon oxide-metal oxide-silicon oxide-nitride nanolaminates, is used in place of the gate structure provided in the following commonly assigned patents: U.S. Pat. Nos. 5,936,274; 6,143,636; 5,973,356; 6,238,976; 5,991,225; 6,153,468; and 6,124,729.

In embodiments of the present invention, the gate structure embodiment of FIG. 5, having silicon oxide-metal oxide-silicon oxide-nitride nanolaminates, is used in place of the gate structure provided in the following commonly assigned pending applications: Forbes, L., "Write Once Read Only Memory Employing Charge Trapping In Gate Insulators," application Ser. No. 10/177,077; Forbes, L., "Write Once Read Only Memory Employing Floating Gates," application Ser. No. 10/177,083; Forbes, L., "Write Once Read Only Memory with Large Work Funchtion Floating Gates," application Ser. No. 10/177,213; Forbes, L., "Nanoncrystal Write Once Read Only Memory for Archival Storage," application Ser. No. 10/177,214; Forbes, L., "Ferroelectric Write Once Read Only Memory for Archival Storage," application Ser. No. 10/177,082; Forbes, L., "Vertical NROM Having a Storage Density of 1 Bit Per 1F²," application Ser. No. 10/177,208; Forbes, L., "Multistate NROM Having a Storage Density Much Greater than 1 Bit Per 1F²," application Ser. No. 10/177,211; Forbes, L., "NOR Flash Memory Cell with High Storage Density," application Ser. No. 10/177,483.

According to the teachings of the present invention, embodiments of the novel transistor herein, which are substituted for the gate structures described in the references above, are programmed by grounding a source line and applying a gate voltage and a voltage to the drain to cause channel hot electron injection. To read the memory state, the drain and ground or source have the normal connections and the conductivity of the transistor determined using low voltages so as not to disturb the memory state. The devices can be erased by applying a large negative voltage to the gate.

In embodiments of the present invention, the gate structure embodiment of FIG. 5, having silicon oxide-metal oxide-silicon oxide-nitride nanolaminates, is used in place of the gate structure provided in the following commonly assigned patents: U.S. Pat. Nos. 5,936,274, 6,143,636, 5,973,356 and 6,238,976 (vertical flash memory devices with high density); U.S. Pat. Nos. 5,991,225 and 6,153,468 (programmable memory address and decode circuits); and U.S. Pat. No. 6,124,729 (programmable logic arrays).

Further, in embodiments of the present invention, the gate structure embodiment of FIG. 5, having silicon oxide-metal oxide-silicon oxide-nitride nanolaminates, is used in place of the gate structure provided in the following Eitan, B. et al., "NROM: A novel localized Trapping, 2-Bit Nonvolatile Memory Cell," *IEEE Electron Device Lett.*, 21(11), 543-545 (November 2000); Eitan, B. et al., "Characterization of Channel Hot Electron Injection by the Subthreshold Slope of NROM device, *IEEE Electron Device Lett.*, 22(11), 556-558 (November 2001); Maayan, E. et al., "A 512 Mb NROM Flash Data Storage Memory with 8 MB/s Data Rate," Dig. IEEE Int. Solid-State Circuits Conf., 100-101 (2002). In these embodiments, the gate structure embodiment of FIG. 5, having silicon oxide-metal oxide-silicon oxide-nitride nanolaminates used in place of the gate structures in those references, can be programmed in the reverse direction and read in the forward direction to obtain more sensitivity in the device characteristics to the stored charge.

All of the above references are incorporated herein in full. The gate structure embodiment of FIG. 5, having silicon oxide-silicon oxide-nitride nanolaminates-silicon oxide, are herein used in place of the gate structure provided in those references to support the various embodiments of the present invention. That is, the present invention incorporates the multitude of device structures described in those references to create a multitude of new embodiments which utilize electron trapping in the insulator nanolaminate gate structure shown in FIG. 5, rather than employing floating gates, as recited in many of the above references.

Sample Operation

Figure 7A:
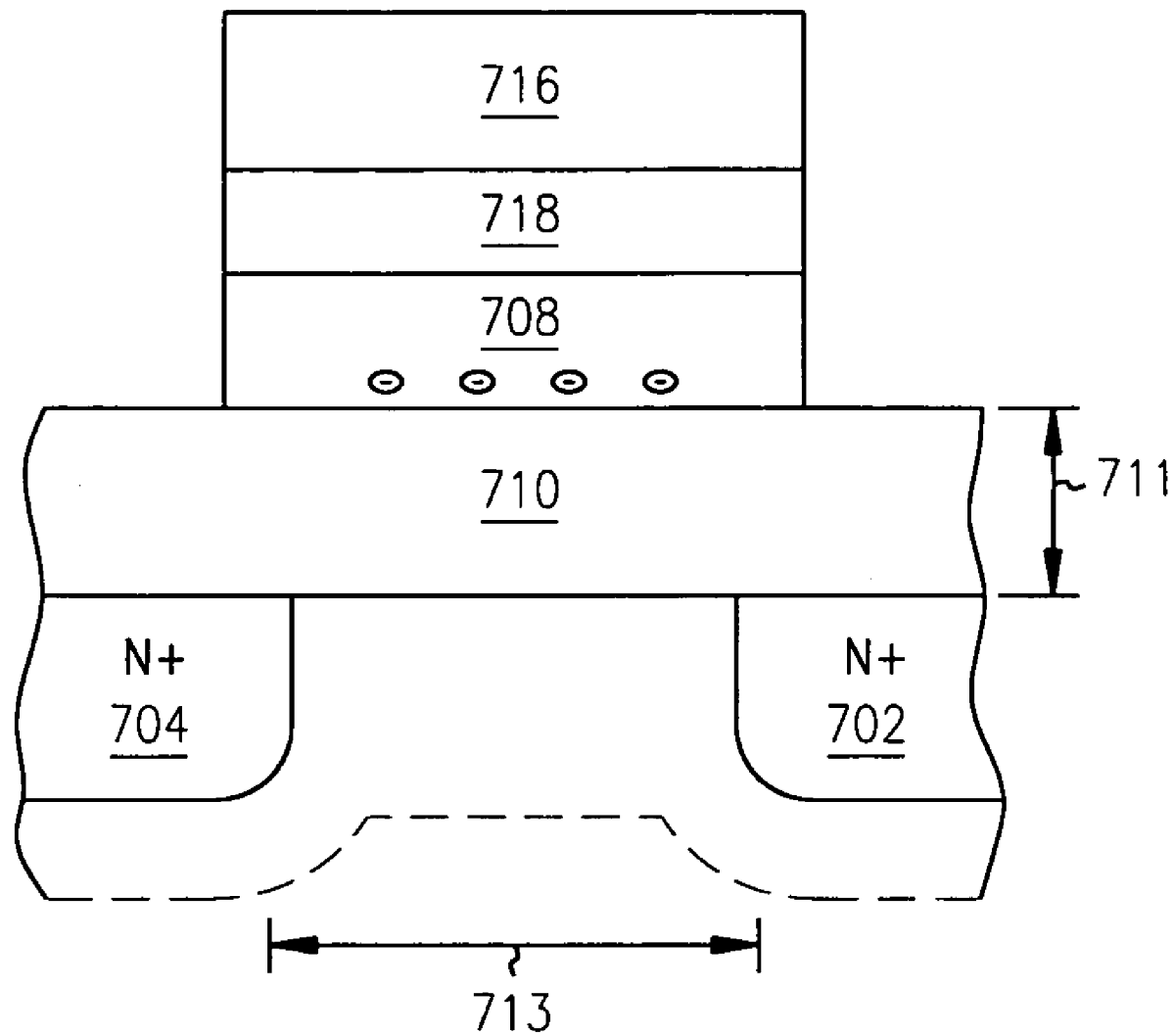
FIGS. 7A-7B illustrates an embodiment for the operation of a transistor cell having oxide-nitride nanolaminate layers according to the teachings of the present invention.
Figure 7B:
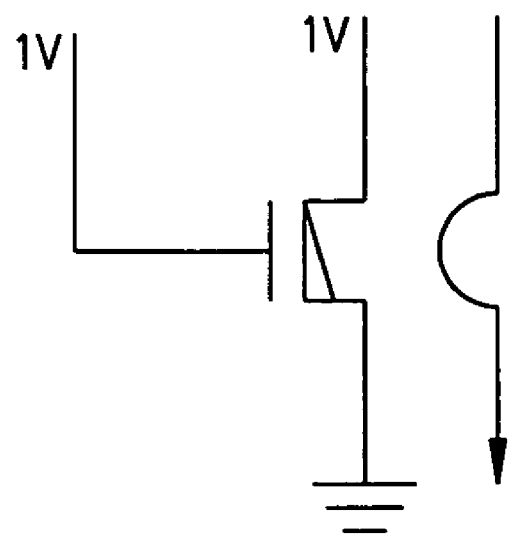
Figure 8:
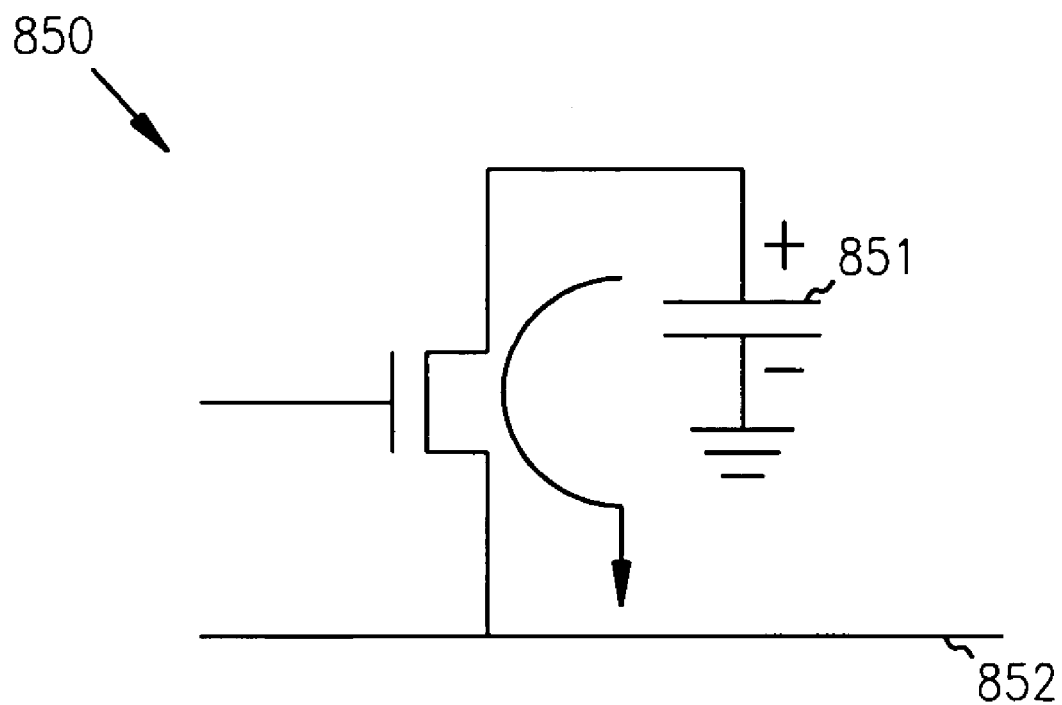
FIG. 8 illustrates the operation of a conventional DRAM cell.

FIGS. 7A-B and 8 are embodiments useful in illustrating the use of charge storage in the oxide-nitride nanolaminate layers to modulate the conductivity of the transistor cell according to the teachings of the present invention. That is, FIGS. 7A-7B illustrates the operation of an embodiment for a novel transistor cell 701 formed according to the teachings of the present invention. And, FIG. 8 illustrates the operation of a conventional DRAM cell 701. As shown in FIG. 7A, the embodiment consists of a gate insulator stack having insulator layers, 710, 708 and 718, e.g. 1. SiO₂/oxide-nitride nanolaminate layers/SiO₂. In the embodiment of FIG. 7A, the gate insulator stack having insulator layers, 710, 708 and 718, has a thickness 711 thicker than in a conventional DRAM cell, e.g. 801 and is equal to or greater than 10 nm or 100 Å ($10^{-6}$ cm). In the embodiment shown in FIG. 7A a transistor cell has dimensions 713 of 0.1 μm ($10^{-5}$ cm) by 0.1 μm. The capacitance, Ci, of the structure depends on the dielectric constant, $\in_i$, and the thickness of the insulating layers, t. In the embodiment, the dielectric constant is $0.3 \times 10^{-12}$ F/cm and the thickness of the insulating layer is $10^{-6}$ cm such that Ci=∈i/t, Farads/cm² or $3 \times 10^{-7}$ F/cm². In one embodiment, a charge of $10^{12}$ electrons/cm² is programmed into the oxide-nitride nanolaminate layers of the transistor cell. Here the charge carriers become trapped in potential wells in the oxide-nitride nanolaminate layers 708 formed by the different electron affinities of the insulators 710, 708 and 718, as shown in FIG. 7A. This produces a stored charge $\Delta Q=10^{12}$ electrons/cm²× $1.6 \times 10^{-19}$ Coulombs. In this embodiment, the resulting change in the threshold voltage ($\Delta$Vt) of the transistor cell will be approximately 0.5 Volts ($\Delta Vt=\Delta Q/Ci$ or $1.6 \times 10^{-7}/3 \times 10^{-7}$=½ Volt). For $\Delta Q=10^{12}$ electrons/cm³ in an area of $10^{-10}$ cm², this embodiment of the present invention involves trapping a charge of approximately 100 electrons in the oxide-nitride nanolaminate layers 708 of the transistor cell. In this embodiment, an original $V_T$ is approximately ½ Volt and the $V_T$ with charge trapping is approximately 1 Volt.

FIG. 7B aids to further illustrate the conduction behavior of the novel transistor cell of the present invention. As one of ordinary skill in the art will understand upon reading this disclosure, if the transistor cell is being driven with a control gate voltage of 1.0 Volt (V) and the nominal threshold voltage without the oxide-nitride nanolaminate layers charged is ½ V, then if the oxide-nitride nanolaminate layers are charged the transistor cell of the present invention will be off and not conduct. That is, by trapping a charge of approximately 100 electrons in the oxide-nitride nanolaminate layers of the transistor cell, having dimensions of 0.1 μm ($10^{-5}$ cm) by 0.1 μm, will raise the threshold voltage of the transistor cell to 1.0 Volt and a 1.0 Volt control gate potential will not be sufficient to turn the device on, e.g. Vt=1.0 V, I=0.

Conversely, if the nominal threshold voltage without the oxide-nitride nanolaminate layers charged is ½ V, then $I=\mu C_{ox} \times (W/L) \times ((Vgs-Vt)^2/2)$, or 12.5 μA, with $\mu C_{ox}=\mu C_i=100$ μA/V² and W/L=1. That is, the transistor cell of the present invention, having the dimensions describe above will produce a current $I=100$ μA/V²×(¼)×(½)=12.5 μA. Thus, in the present invention an un-written, or un-programmed transistor cell can conduct a current of the order 12.5 μA, whereas if the oxide-nitride nanolaminate layers are charged then the transistor cell will not conduct. As one of ordinary skill in the art will understand upon reading this disclosure, the sense amplifiers used in DRAM arrays, and as describe above, can easily detect such differences in current on the bit lines.

By way of comparison, in a conventional DRAM with 30 femtoFarad (fF) storage capacitor 851 charged to 50 femto Columbs (fC), if these are read over 5 nS then the average current on a bit line 852 is only 10 μA (I=50 fC/5 ns=10 μA). Thus, storing a 50 fC charge on the storage capacitor equates to storing 300,000 electrons (Q=50 f/C/(1.6×10⁻¹⁹)=30× 10⁴=300.000 electrons).

According to the teachings of the present invention, the transistor cells, having the gate structure with oxide-nitride nanolaminate layers, in the array are utilized not just as passive on or off switches as transfer devices in DRAM arrays but rather as active devices providing gain. In the present invention, to program the transistor cell "off," requires only a stored charge in the oxide-nitride nanolaminate layers of about 100 electrons if the area is 0.1 μm by 0.1 μm. And, if the transistor cell is un-programmed, e.g. no stored charge trapped in the oxide-nitride nanolaminate layers, and if the transistor cell is addressed over 10 nS a current of 12.5 μA is provided. The integrated drain current then has a charge of 125 fC or 800,000 electrons. This is in comparison to the charge on a DRAM capacitor of 50 fC which is only about 300,000 electrons. Hence, the use of transistor cells, having the gate structure with oxide-nitride nanolaminate layers, in the array as active devices with gain, rather than just switches, provides an amplification of the stored charge, in the oxide-nitride nanolaminate layers, from 100 to 800,000 electrons over a read address period of 10 nS.

Sample Device Applications

Figure 9:
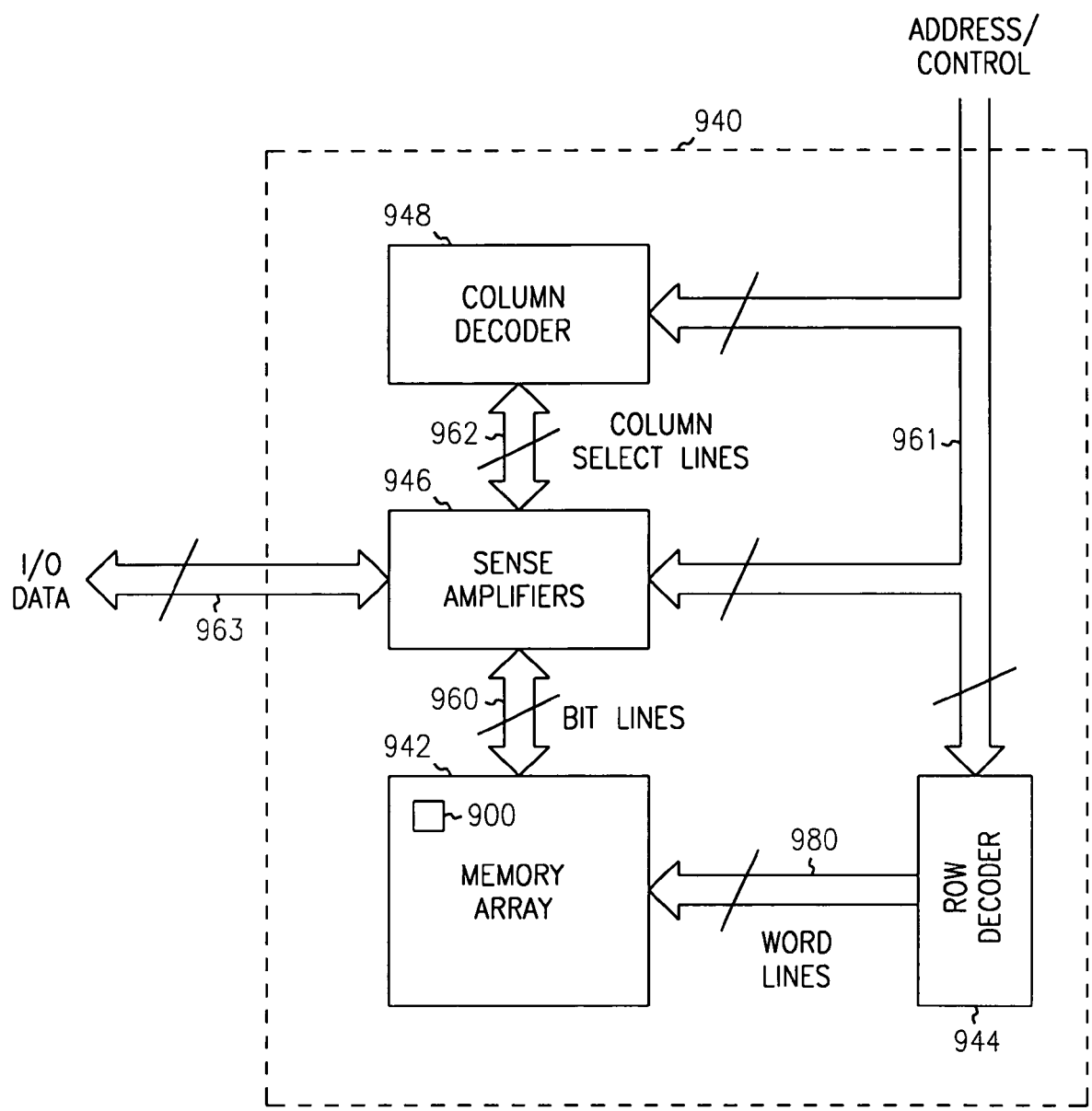
FIG. 9 illustrates an embodiment of a memory device according to the teachings of the present invention.

In FIG. 9 a memory device is illustrated according to the teachings of the present invention. The memory device 940 contains a memory array 942, row and column decoders 944, 948 and a sense amplifier circuit 946. The memory array 942 consists of a plurality of transistor cells 900, having oxide-nitride nanolaminate layers in the gate stack, whose word lines 980 and bit lines 960 are commonly arranged into rows and columns, respectively. The bit lines 960 of the memory array 942 are connected to the sense amplifier circuit 946, while its word lines 980 are connected to the row decoder 944. Address and control signals are input on address/control lines 961 into the memory device 940 and connected to the column decoder 948, sense amplifier circuit 946 and row decoder 944 and are used to gain read and write access, among other things, to the memory array 942.

The column decoder 948 is connected to the sense amplifier circuit 946 via control and column select signals on column select lines 962. The sense amplifier circuit 946 receives input data destined for the memory array 942 and outputs data read from the memory array 942 over input/output (I/O) data lines 963. Data is read from the cells of the memory array 942 by activating a word line 980 (via the row decoder 944), which couples all of the memory cells corresponding to that word line to respective bit lines 960, which define the columns of the array. One or more bit lines 960 are also activated. When a particular word line 980 and bit lines 960 are activated, the sense amplifier circuit 946 connected to a bit line column detects and amplifies the conduction sensed through a given transistor cell and transferred to its bit line 960 by measuring the potential difference between the activated bit line 960 and a reference line which may be an inactive bit line. Again, in the read operation the source region of a given cell is couple to a grounded sourceline or array plate (not shown). The operation of Memory device sense amplifiers is described, for example, in U.S. Pat. Nos. 5,627,785; 5,280,205; and 5,042,011, all assigned to Micron Technology Inc., and incorporated by reference herein.

Figure 10:
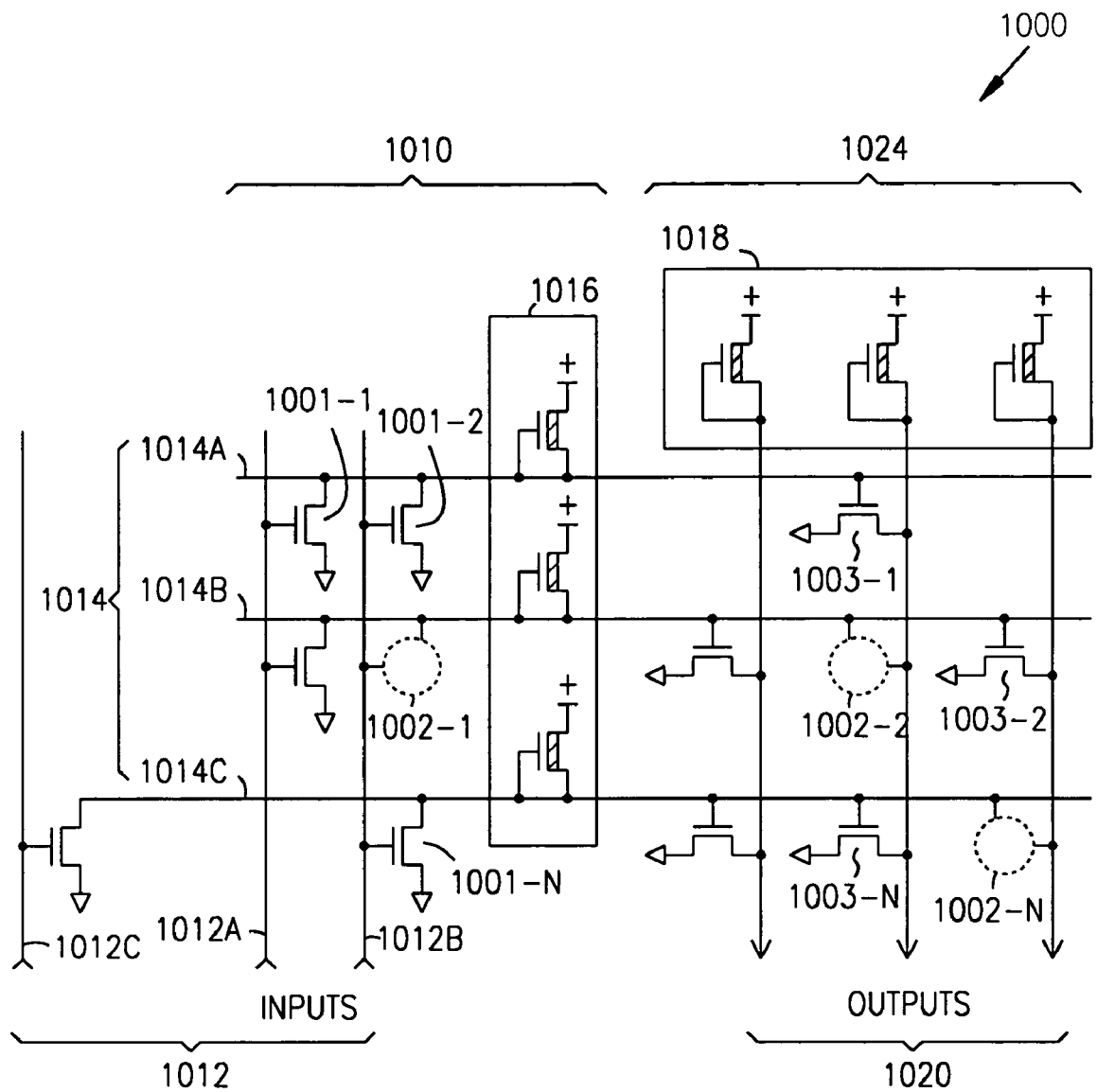
FIG. 10 is a schematic diagram illustrating a conventional NOR-NOR programmable logic array.

FIG. 10 shows a conventional NOR-NOR logic array 1000 which is programmable at the gate mask level by either fabricating a thin oxide gate transistor, e.g. logic cells 1001-1, 1001-2, . . . , 1001-N and 1003-1, 1003-2, . . . , 1003-N, at the intersection of lines in the array or not fabricating a thin oxide gate transistor, e.g. missing thin oxide transistors, 1002-1, 1002-2, . . . , 1002-N, at such an intersection. As one of ordinary skill in the art will understand upon reading this disclosure, the same technique is conventionally used to form other types of logic arrays not shown. As shown in FIG. 10, a number of depletion mode NMOS transistors, 1016 and 1018 respectively, are used as load devices.

The conventional logic array shown in FIG. 10 includes a first logic plane 1010 which receives a number of input signals at input lines 1012. In this example, no inverters are provided for generating complements of the input signals. However, first logic plane 1010 can include inverters to produce the complementary signals when needed in a specific application.

First logic plane 1010 includes a number of thin oxide gate transistors, e.g. transistors 1001-1, 1001-2, . . . , 1001-N. The thin oxide gate transistors, 1001-1, 1001-2, . . . , 1001-N, are located at the intersection of input lines 1012, and interconnect lines 1014. In the conventional PLA of FIG. 10, this selective fabrication of thin oxide gate transistor, e.g. transistors 1001-1, 1001-2, . . . , 1001-N, is referred to as programming since the logical function implemented by the programmable logic array is entered into the array by the selective arrangement of the thin oxide gate transistors, or logic cells, 1001-1, 1001-2, . . . , 1001-N, at the intersections of input lines 1012, and interconnect lines 1014 in the array.

In this embodiment, each of the interconnect lines 1014 acts as a NOR gate for the input lines 1012 that are connected to the interconnect lines 1014 through the thin oxide gate transistors, 1001-1, 1001-2, . . . , 1001-N, of the array. For example, interconnection line 1014A acts as a NOR gate for the signals on input lines 1012A and 1012B. That is, interconnect line 1014A is maintained at a high potential unless one or more of the thin oxide gate transistors, 1001-1, 1001-2, . . . , 1001-N, that are coupled to interconnect line 1014A are turned on by a high logic level signal on one of the input lines 1012. When a control gate address is activated, through input lines 1012, each thin oxide gate transistor, e.g. transistors 1001-1, 1001-2, . . . , 1001-N, conducts which performs the NOR positive logic circuit function, an inversion of the OR circuit function results from inversion of data onto the interconnect lines 1014 through the thin oxide gate transistors, 1001-1, 1001-2, . . . , 1001-N, of the array.

As shown in FIG. 10, a second logic plane 1024 is provided which includes a number of thin oxide gate transistor, e.g. transistors 1003-1, 1003-2, . . . , 1003-N. The thin oxide gate transistors, 1003-1, 1003-2, . . . , 1003-N, are located at the intersection of interconnect lines 1014, and output lines 1020. Here again, the logical function of the second logic plane 1024 is implemented by the selective arrangement of the thin oxide gate transistors, 1003-1, 1003-2, . . . , 1003-N, at the intersections of interconnect lines 1014, and output lines 1020 in the second logic plane 1024. The second logic plane 1024 is also configured such that the output lines 1020 comprise a logical NOR function of the signals from the interconnection lines 1014 that are coupled to particular output lines 1020 through the thin oxide gate transistors, 1003-1, 1003-2, . . . , 1003-N, of the second logic plane 1024. Thus, in FIG. 10, the incoming signals on each line are used to drive the gates of transistors in the NOR logic array as the same is known by one of ordinary skill in the art and will be understood by reading this disclosure.

Figure 11:
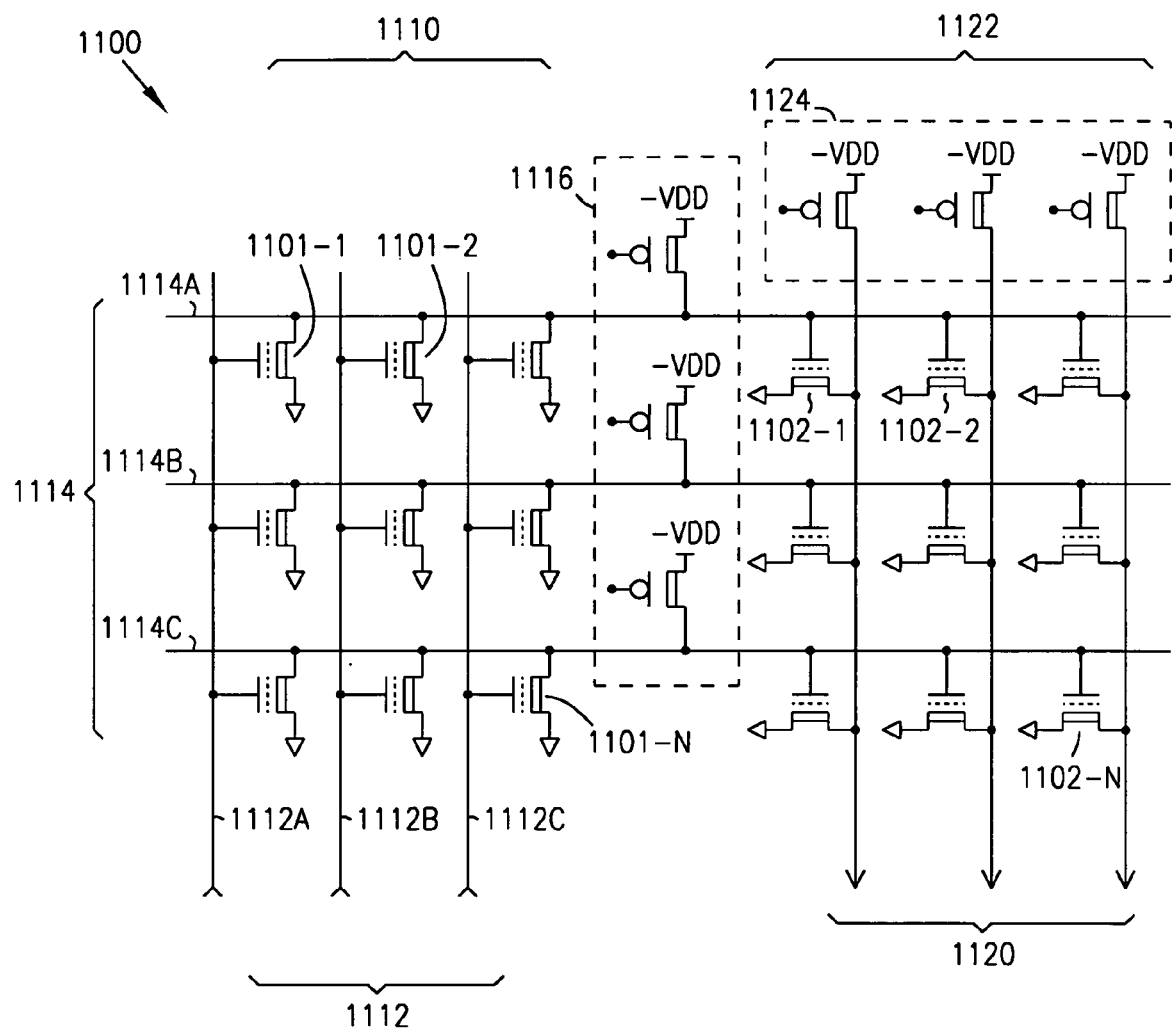
FIG. 11 is a schematic diagram illustrating generally an architecture of one embodiment of a programmable logic array (PLA) with logic cells, having oxide-nitride nanolaminate layers according to the teachings of the present invention.

FIG. 11 illustrates an embodiment of a novel in-service programmable logic array (PLA) formed with logic cells having a gate structure with oxide-nitride nanolaminate layers, according to the teachings of the present invention. In FIG. 11, PLA 1100 implements an illustrative logical function using a two level logic approach. Specifically, PLA 1100 includes first and second logic planes 1110 and 1122. In this example, the logic function is implemented using NOR-NOR logic. As shown in FIG. 11, first and second logic planes 1110 and 1122 each include an array of, logic cells, having a gate structure with oxide-nitride nanolaminate layers, which serve as driver transistors, 1101-1, 1101-2, . . . , 1101-N, and 1102-

1, 1102-2, ..., 1102-N respectively, formed according to the teachings of the present invention. The driver transistors, 1101-1, 1101-2, ..., 1101-N, and 1102-1, 1102-2, ..., 1102-N, have their first source/drain regions coupled to source lines or a conductive source plane. These driver transistors, 1101-1, 1101-2, ..., 1101-N, and 1102-1, 1102-2, ..., 1102-N are configured to implement the logical function of FPLA 1100. The driver transistors, 1101-1, 1101-2, ..., 1101-N, and 1102-1, 1102-2, ..., 1102-N are shown as n-channel transistors. However, the invention is not so limited. Also, as shown in FIG. 11, a number of p-channel metal oxide semiconductor (PMOS) transistors are provided as load device transistors, 1116 and 1124 respectively, having their source regions coupled to a voltage potential (VDD). These load device transistors, 1116 and 1124 respectively, operate in complement to the driver transistors, 1101-1, 1101-2, ..., 1101-N, and 1102-1, 1102-2, ..., 1102-N to form load inverters.

It is noted that the configuration of FIG. 11 is provided by way of example and not by way of limitation. Specifically, the teachings of the present application are not limited to programmable logic arrays in the NOR-NOR approach. Further, the teachings of the present application are not limited to the specific logical function shown in FIG. 11. Other logical functions can be implemented in a programmable logic array, with the driver transistors, having a gate structure with oxide-nitride nanolaminate layers, 1101-1, 1101-2, ..., 1101-N, and 1102-1, 1102-2, ..., 1102-N and load device transistors, 1116 and 1124 respectively, of the present invention, using any one of the various two level logic approaches.

First logic plane 1110 receives a number of input signals at input lines 1112. In this example, no inverters are provided for generating complements of the input signals. However, first logic plane 1110 can include inverters to produce the complementary signals when needed in a specific application.

First logic plane 1110 includes a number of driver transistors, having a gate structure with oxide-nitride nanolaminate layers, 1101-1, 1101-2, ..., 1101-N, that form an array. The driver transistors, 1101-1, 1101-2, ..., 1101-N, are located at the intersection of input lines 1112, and interconnect lines 1114. Not all of the driver transistors, 1101-1, 1101-2, ..., 1101-N, are operatively conductive in the first logic plane. Rather, the driver transistors, 1101-1, 1101-2, ..., 1101-N, are selectively programmed, as has been described herein, to respond to the input lines 1112 and change the potential of the interconnect lines 1114 so as to implement a desired logic function. This selective interconnection is referred to as programming since the logical function implemented by the programmable logic array is entered into the array by the driver transistors, 1101-1, 1101-2, ..., 1101-N, that are used at the intersections of input lines 1112, and interconnect lines 1114 in the array.

In this embodiment, each of the interconnect lines 1114 acts as a NOR gate for the input lines 1112 that are connected to the interconnect lines 1114 through the driver transistors, 1101-1, 1101-2, ..., 1101-N, of the array 1100. For example, interconnection line 1114A acts as a NOR gate for the signals on input lines 1112A, 1112B and 1112C. Programmability of the driver transistors, 1101-1, 1101-2, ..., 1101-N is achieved by trapping charge carriers in potential wells in the oxide-nitride nanolaminate layers of the gate stack, as described herein. When the oxide-nitride nanolaminate layers are charged, that driver transistor, 1101-1, 1101-2, ..., 1101-N will remain in an off state until it is reprogrammed. Applying and removing a charge to the oxide-nitride nanolaminate layers, is performed by tunneling charge into the oxide-nitride nanolaminate layers of the driver transistors, 1101-1, 1101-2, ..., 1101-N. A driver transistors, 1101-1, 1101-2, ..., 1101-N programmed in an off state remains in that state until the charge is removed from the oxide-nitride nanolaminate layers.

Driver transistors, 1101-1, 1101-2, ..., 1101-N not having their corresponding gate structure with oxide-nitride nanolaminate layers charged operate in either an on state or an off state, wherein input signals received by the input lines 1112A, 1112B and 1112C determine the applicable state. If any of the input lines 1112A, 1112B and 1112C are turned on by input signals received by the input lines 1112A, 1112B and 1112C, then a ground is provided to load device transistors 1116. The load device transistors 1116 are attached to the interconnect lines 1114. The load device transistors 1116 provide a low voltage level when any one of the driver transistors, 1101-1, 1101-2, ..., 1101-N connected to the corresponding interconnect line 1114 is activated. This performs the NOR logic circuit function, an inversion of the OR circuit function results from inversion of data onto the interconnect lines 1114 through the driver transistors, 1101-1, 1101-2, ..., 1101-N of the array 1100. When the driver transistors, 1101-1, 1101-2, ..., 1101-N are in an off state, an open is provided to the drain of the load device transistors 1116. The VDD voltage level is applied to corresponding input lines, e.g. the interconnect lines 1114 for second logic plane 1122 when a load device transistors 1116 is turned on by a clock signal received at the gate of the load device transistors 1116. Each of the driver transistors, 1101-1, 1101-2, ..., 1101-N described herein are formed according to the teachings of the present, having a gate structure with oxide-nitride nanolaminate layers.

In a similar manner, second logic plane 1122 comprises a second array of driver transistors, 1102-1, 1102-2, ..., 1102-N that are selectively programmed to provide the second level of the two level logic needed to implement a specific logical function. In this embodiment, the array of driver transistors, 1102-1, 1102-2, ..., 1102-N is also configured such that the output lines 1120 comprise a logical NOR function of the signals from the interconnection lines 1114 that are coupled to particular output lines 1120 through the driver transistors, 1102-1, 1102-2, ..., 1102-N of the second logic plane 1122.

Programmability of the driver transistors, 1102-1, 1102-2, ..., 1102-N is achieved by trapping charge carriers in potential wells in the oxide-nitride nanolaminate layers of the gate stack, as described herein. When the oxide-nitride nanolaminate layers are charged, that driver transistor, 1102-1, 1102-2, ..., 1102-N will remain in an off state until it is reprogrammed. Applying and removing a charge to the oxide-nitride nanolaminate layers are performed by tunneling charge into the oxide-nitride nanolaminate layers of the driver transistors, 1101-1, 1101-2, ..., 1101-N. A driver transistor, e.g. 1102-1, 1102-2, ..., 1102-N, programmed in an off state remains in that state until the charge is removed from the oxide-nitride nanolaminate layers.

Driver transistors, 1102-1, 1102-2, ..., 1102-N not having their corresponding gate structure with oxide-nitride nanolaminate layers charged operate in either an on state or an off state, wherein signals received by the interconnect lines 1114 determine the applicable state. If any of the interconnect lines 1114 are turned on, then a ground is provided to load device transistors 1124 by applying a ground potential to the source line or conductive source plane coupled to the transistors first source/drain region as described herein. The load device transistors 1124 are attached to the output lines 1120. The load device transistors 1124 provide a low voltage level when any one of the driver transistors, 1102-1, 1102-2, ..., 1102-N connected to the corresponding output line is activated. This performs the NOR logic circuit function, an inversion of the OR circuit function results from inversion of data onto the output lines 1120 through the driver transistors, 1102-1, 1102-2, . . . , 1102-N of the array 1100. When the driver transistors, 1102-1, 1102-2, . . . , 1102-N are in an off state, an open is provided to the drain of the load device transistors 1124. The VDD voltage level is applied to corresponding output lines 1120 for second logic plane 1122 when a load device transistor 1124 is turned on by a clock signal received at the gate of the load device transistors 1124. In this manner a NOR-NOR electrically programmable logic array is most easily implemented utilizing the normal PLA array structure. Each of the driver transistors, 1102-1, 1102-2, . . . , 1102-N described herein are formed according to the teachings of the present, having a gate structure with oxide-nitride nanolaminate layers.

Thus FIG. 11 shows an embodiment for the application of the novel transistor cells, having a gate structure with oxide-nitride nanolaminate layers, in a logic array. If a driver transistors, 1101-1, 1101-2, . . . , 1101-N, and 1102-1, 1102-2, . . . , 1102-N, is programmed with a negative charge trapped in potential wells, formed with the oxide-nitride nanolaminate layers, it is effectively removed from the array. In this manner the array logic functions can be programmed even when the circuit is in the final circuit or in the field and being used in a system.

The absence or presence of charge trapped in potential wells, formed by the oxide-nitride nanolaminate layers, is read by addressing the input lines 1112 or control gate lines and y-column/sourcelines to form a coincidence in address at a particular logic cell. The control gate line would for instance be driven positive at some voltage of 1.0 Volts and the y-column/sourceline grounded, if the oxide-nitride nanolaminate layers are not charged with electrons then the transistor would turn on tending to hold the interconnect line on that particular row down indicating the presence of a stored "one" in the cell. If this particular transistor cell has charge trapped in potential wells, formed by the oxide-nitride nanolaminate layers, the transistor will not turn on and the presence of a stored "zero" is indicated in the cell. In this manner, data stored on a particular transistor cell can be read.

Programming can be achieved by hot electron injection. In this case, the interconnect lines, coupled to the second source/drain region for the transistor cells in the first logic plane, are driven with a higher drain voltage like 2 Volts for 0.1 micron technology and the control gate line is addressed by some nominal voltage in the range of twice this value. Erasure is accomplished by driving the control gate line with a large positive voltage and the sourceline and/or backgate or substrate/well address line of the transistor with a negative bias so the total voltage difference is in the order of 3 Volts causing electrons to tunnel out of the oxide-nitride nanolaminate layers of the driver transistors. Writing can be performed, as also described above, by normal channel hot electron injection One of ordinary skill in the art will appreciate upon reading this disclosure that a number of different configurations for the spatial relationship, or orientation of the input lines 1112, interconnect lines 1114, and output lines 1120 are possible.

Figure 12:
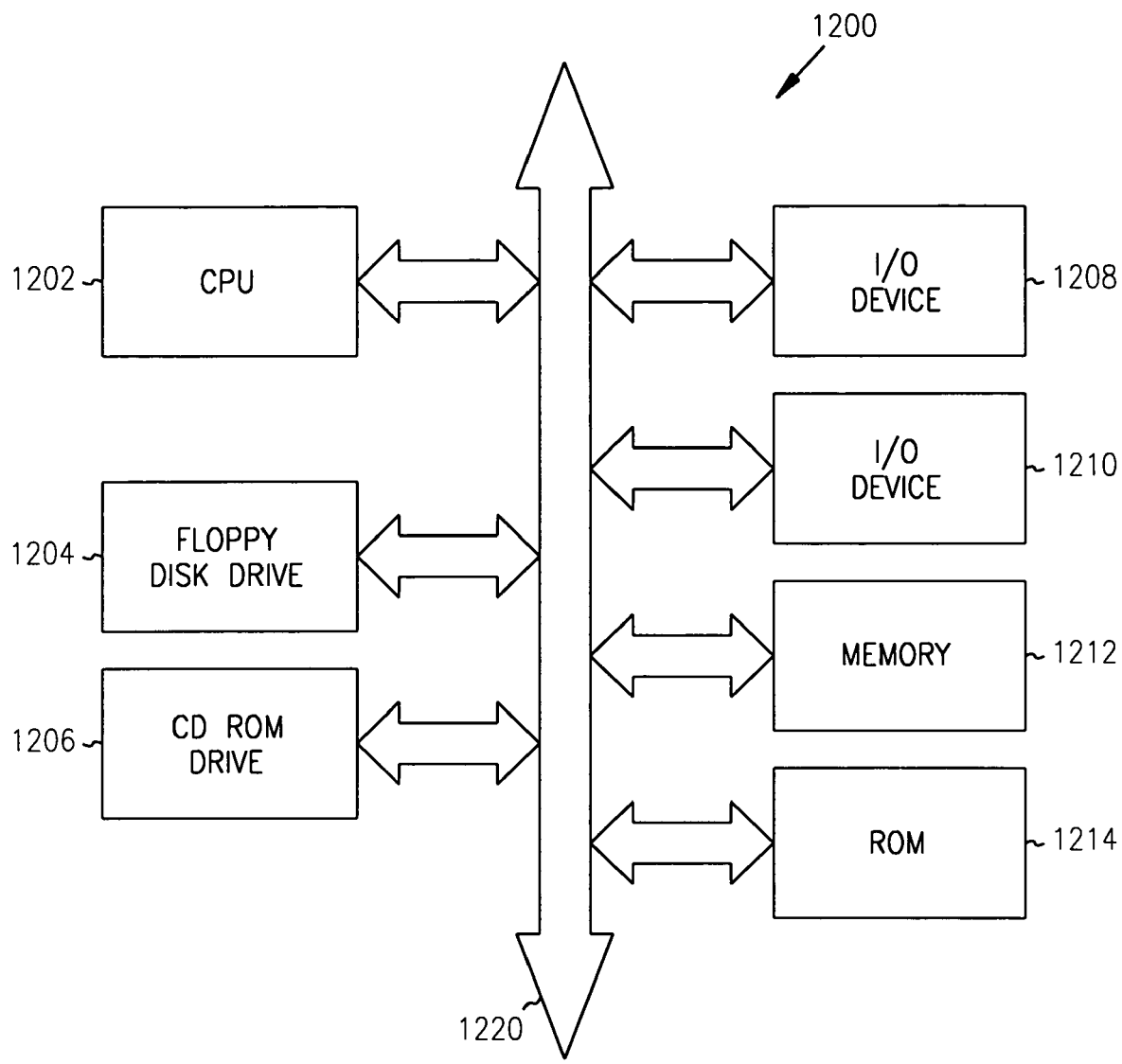
FIG. 12 is a block diagram of an electrical system, or processor-based system, utilizing oxide nanolaminates constructed in accordance with the present invention.

FIG. 12 is a block diagram of an electrical system, or processor-based system, 1200 utilizing transistor cells with a gate structure having oxide-nitride nanolaminate layers. By way of example and not by way of limitation, memory 1212 is constructed in accordance with the present invention to have transistor cells with a gate structure having oxide-nitride nanolaminate layers. The same applies to transistors in the CPU, etc., the invention is not so limited. The processor-based system 1200 may be a computer system, a process control system or any other system employing a processor and associated memory. The system 1200 includes a central processing unit (CPU) 1202, e.g., a microprocessor, that communicates with the NOR flash memory 1212 and an I/O device 1208 over a bus 1220. It must be noted that the bus 1220 may be a series of buses and bridges commonly used in a processor-based system, but for convenience purposes only, the bus 1220 has been illustrated as a single bus. A second I/O device 1210 is illustrated, but is not necessary to practice the invention. The processor-based system 1200 can also includes read-only memory (ROM) 1214 and may include peripheral devices such as a floppy disk drive 1204 and a compact disk (CD) ROM drive 1206 that also communicates with the CPU 1202 over the bus 1220 as is well known in the art.

It will be appreciated by those skilled in the art that additional circuitry and control signals can be provided, and that the memory device 1200 has been simplified to help focus on the invention. In one embodiment, at least one of the transistor cells, having a gate structure with oxide-nitride nanolaminate layers in memory 1212 includes a programmed transistor cell according to the teachings of the present invention.

It will be understood that the embodiment shown in FIG. 12 illustrates an embodiment for electronic system circuitry in which the novel transistor cells of the present invention are used. The illustration of system 1200, as shown in FIG. 12, is intended to provide a general understanding of one application for the structure and circuitry of the present invention, and is not intended to serve as a complete description of all the elements and features of an electronic system using the novel transistor cell structures. Further, the invention is equally applicable to any size and type of memory device 1200 using the novel transistor cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel transistor cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

This disclosure describes the use of oxide-nitride nanolaminate layers with charge trapping in potential wells formed by the different electron affinities of the insulator layers. The disclosure describes the fabrication by atomic layer deposition, ALD, and use of oxide-nitride-oxide nanolaminates. In embodiments of the invention, these nitride material are of the order of 4 nanometers in thickness, with a range of 1 to 10 nm. The compositions of these materials are adjusted so as that they have an electron affinity less than silicon oxide which is 4.1 eV, resulting in a positive conduction band offset. The gate insulator structure embodiments of the present invention, having silicon oxide-metal oxide-silicon oxide-nitride nanolaminates, are employed in a wide variety of different device applications.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for operating a memory, comprising:
writing to one or more vertical MOSFETs arranged in rows and columns extending outwardly from a substrate and separated by trenches in a DRAM array in a reverse direction, wherein each MOSFET in the DRAM array includes a source region, a drain region, a channel region between the source and the drain regions, and a gate separated from the channel region by a gate insulator in the trenches, wherein the gate insulator includes oxide-nitride nanolaminate layers with charge trapping in potential wells formed by different electron affinities of the oxide-nitride nanolaminate layers, wherein the DRAM array includes a number of sourcelines formed in a bottom of the trenches between rows of the vertical MOSFETs and coupled to the source regions of each transistor along rows the vertical MOSFETs, wherein along columns of the vertical MOSFETs the source region of each column adjacent vertical MOSFET couple to the sourceline in a shared trench, and wherein the DRAM array includes a number of bitlines coupled to the drain region along rows in the DRAM array, and wherein programming the one or more vertical MOSFETs in the reverse direction includes;
biasing a sourceline for two column adjacent vertical MOSFETs sharing a trench to a voltage higher than VDD;
grounding a bitline coupled to one of the drain regions of the two column adjacent vertical MOSFETs in the vertical MOSFET to be programmed;
applying a gate potential to the gate for each of the two column adjacent vertical MOSFETs to create a hot electron injection into the gate insulator of the vertical MOSFET to be programmed adjacent to the source region such that an addressed MOSFET becomes a programmed MOSFET and will operate at reduced drain source current in a forward direction;
reading one or more vertical MOSFETs in the DRAM array in a forward direction, wherein reading the one or more MOSFETs in the forward direction includes;
grounding a sourceline for two column adjacent vertical MOSFETs sharing a trench;
precharging the drain regions of the two column adjacent vertical MOSFETs sharing a trench to a fractional voltage of VDD;
applying a gate potential of approximately 1.0 Volt to the gate for each of the two column adjacent vertical MOSFETs sharing a trench such that a conductivity state of an addressed vertical MOSFET can be compared to a conductivity state of a reference cell; and
wherein storing the charge within the storage layer less than or equal to 10 nanometers thick includes storing a charge within a storage layer approximately 4 nanometers thick.

2. The method of claim 1, wherein creating a hot electron injection into the gate insulator of the addressed MOSFET adjacent to the source region includes creating a first threshold voltage region (Vt1) adjacent to the drain region and creating a second threshold voltage region (Vt2) adjacent to the source region, wherein Vt2 is greater that Vt1.

3. The method of claim 1, wherein reading one or more vertical MOSFETs in the DRAM array in a forward direction includes using a sense amplifier to detect whether an addressed vertical MOSFET is a programmed vertical MOSFET, wherein a programmed vertical MOSFET will not conduct, and wherein an un-programmed vertical MOSFET addressed over approximately 10 ns will conduct a current of approximately 12.5 µA such that the method includes detecting an integrated drain current having a charge of 800,000 electrons using the sense amplifier.

4. The method of claim 1, wherein in creating a hot electron injection into the gate insulator of an addressed vertical MOSFET includes changing a threshold voltage for the vertical MOSFET by approximately 0.5 Volts.

5. The method of claim 1, wherein creating a hot electron injection into the gate insulator of the addressed vertical MOSFET includes trapping a stored charge in the gate insulator of the addressed vertical MOSFET of approximately $10^{12}$ electrons/cm$^2$.

6. The method of claim 1, wherein creating a hot electron injection into the gate insulator of the addressed vertical MOSFET includes trapping a stored charge in the gate insulator of the addressed vertical MOSFET of approximately 100 electrons.

7. The method of claim 1, wherein the method further includes using the vertical MOSFET as active device with gain, and wherein reading a programmed vertical MOSFET includes providing an amplification of a stored charge in the gate insulator from 100 to 800,000 electrons over a read address period of approximately 10 ns.

8. A method of operating a memory array, comprising:
writing a memory state to at least one of a plurality of vertical transistors in an array, including;
storing a charge within a storage layer of a nanolaminate insulator, wherein the storage layer is formed using atomic layer deposition techniques, and the nanolaminate insulator is located on a trench wall, and wherein the nanolaminate insulator layer separates a channel region within the trench wall from a gate located over the nanolaminate insulator within the trench;
wherein storing the charge is performed in a first direction;
reading the memory state of the vertical transistor in a second direction opposite from the first direction; and
further including comparing a source/drain current in the vertical transistor a reference source/drain current in a second vertical transistor.

9. The method of claim 8, wherein comparing the source/drain current to the reference source/drain current includes comparing to a reference source/drain current in a second vertical transistor located on an adjacent wall of the trench.

10. The method of claim 8, wherein storing the charge within the storage layer of a nanolaminate insulator includes storing a charge within a storage layer less than or equal to 10 nanometers thick.

11. A method of operating a memory array, comprising:
writing a memory state to at least one of a plurality of vertical transistors in an array, including;
storing a charge within a storage layer of a nanolaminate insulator, wherein the storage layer is formed using atomic layer deposition techniques, and the nanolaminate insulator is located on a trench wall, and wherein the nanolaminate insulator layer separates a channel region within the trench wall from a gate located over the nanolaminate insulator within the trench;

wherein storing the charge is performed in a first direction; and reading the memory state of the vertical transistor in a second direction opposite from the first direction, including comparing a source/drain current of the vertical transistor in the second direction with source/drain current of a vertical reference transistor on an adjacent side of the trench.

12. The method of claim 11, wherein comparing a source/drain current of the vertical transistor in the second direction with source/drain current of a vertical reference transistor includes utilizing a common source line buried in a base of the trench.

13. The method of claim 11, wherein comparing a source/drain current of the vertical transistor in the second direction with source/drain current of a vertical reference transistor includes utilizing a gate that is shared between the vertical transistor and the reference vertical transistor.

14. The method of claim 11, wherein storing the charge within the storage layer of a nanolaminate insulator includes storing a charge within a storage layer less than or equal to 10 nanometers thick.

15. The method of claim 14, wherein storing the charge within the storage layer less than or equal to 10 nanometers thick includes storing a charge within a storage layer approximately 4 nanometers thick.

16. A method of operating a memory array, comprising:

writing a memory state to at least one of a plurality of vertical transistors in an array, including;

storing a charge within a nitride storage layer of a nanolaminate insulator, wherein the nitride storage layer is formed using atomic layer deposition techniques, and the nanolaminate insulator is located on a trench wall, and wherein the nanolaminate insulator layer separates a channel region within the trench wall from a gate located over the nanolaminate insulator within the trench;

wherein storing the charge is performed in a first direction;

reading the memory state of the vertical transistor in a second direction opposite from the first direction; and wherein storing a charge within a nitride storage layer includes storing a charge within a Storage layer with an electron affinity less than 4.1 eV providing a positive conduction band offset with silicon oxide.

17. The method of claim 16, wherein storing a charge within a nitride storage layer includes storing a charge within a silicon nitride storage layer.

18. The method of claim 16, wherein storing a charge within a nitride storage layer includes storing a charge within an aluminum nitride storage layer.

19. The method of claim 16, wherein storing a charge within a nitride storage layer includes storing a charge within a gallium nitride storage layer.

20. The method of claim 16, wherein storing a charge within a nitride storage layer includes storing a charge within a gallium aluminum nitride storage layer.

21. The method of claim 16, wherein storing a charge within a nitride storage layer includes storing a charge within a tantalum aluminum nitride storage layer.

22. The method of claim 16, wherein storing a charge within a nitride storage layer includes storing a charge within a titanium silicon nitride storage layer.

23. The method of claim 16, wherein storing a charge within a nitride storage layer includes storing a charge within a titanium aluminum nitride storage layer.

24. The method of claim 16, wherein storing a charge within a nitride storage layer includes storing a charge within a tungsten aluminum nitride storage layer.

* * * * *